(12) United States Patent
Watts et al.

(10) Patent No.: US 11,837,559 B2
(45) Date of Patent: Dec. 5, 2023

(54) GROUP III NITRIDE-BASED RADIO FREQUENCY AMPLIFIERS HAVING BACK SIDE SOURCE, GATE AND/OR DRAIN TERMINALS

(71) Applicant: Cree, Inc., Durham, NC (US)

(72) Inventors: Michael E. Watts, Scottsdale, AZ (US); Mario Bokatius, Chandler, AZ (US); Jangheon Kim, Chandler, AZ (US); Basim Noori, San Jose, CA (US); Qianli Mu, San Jose, CA (US); Kwangmo Chris Lim, San Jose, CA (US); Marvin Marbell, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 48 days.

(21) Appl. No.: 17/211,281

(22) Filed: Mar. 24, 2021

(65) Prior Publication Data
US 2021/0313286 A1    Oct. 7, 2021

Related U.S. Application Data

(60) Provisional application No. 63/004,962, filed on Apr. 3, 2020.

(51) Int. Cl.
*H01L 23/66* (2006.01)
*H01L 23/00* (2006.01)
(Continued)

(52) U.S. Cl.
CPC .............. *H01L 23/66* (2013.01); *H01L 24/49* (2013.01); *H01L 29/2003* (2013.01);
(Continued)

(58) Field of Classification Search
CPC ........... H01L 23/49531; H01L 23/3677; H01L 23/4334; H01L 24/49; H01L 23/057;
(Continued)

(56) References Cited

U.S. PATENT DOCUMENTS 3,969,745 A * 7/1976 Blocker, III .......... H01L 23/481
257/E29.127
6,586,833 B2 7/2003 Baliga
(Continued)

FOREIGN PATENT DOCUMENTS

EP         1693891 B1    7/2019
EP         3783663 A1    2/2021
(Continued)

OTHER PUBLICATIONS

"Notification of Transmittal of the International Search Report and the Written Opinion of the International Searching Authority, or the Declaration for corresponding International Application No. PCT/US2021/021845, dated Jul. 5, 2021, (14 pages)".

(Continued)

*Primary Examiner* — Mouloucoulaye Inoussa
(74) *Attorney, Agent, or Firm* — Myers Bigel, P.A.

(57) ABSTRACT

RF amplifiers are provided that include an interconnection structure and a Group III nitride-based RF amplifier die that is mounted on top of the interconnection structure. The Group III nitride-based RF amplifier die includes a semiconductor layer structure. A plurality of unit cell transistors are provided in an upper portion of the semiconductor layer structure, and a gate terminal, a drain terminal and a source terminal are provided on a lower surface of the semiconductor layer structure that is adjacent the interconnection structure.

20 Claims, 17 Drawing Sheets

(51) Int. Cl.
*H01L 29/20* (2006.01)
*H01L 29/417* (2006.01)
*H01L 29/778* (2006.01)

(52) U.S. Cl.
CPC .... *H01L 29/41775* (2013.01); *H01L 29/7786* (2013.01); *H01L 2223/6611* (2013.01); *H01L 2223/6616* (2013.01); *H01L 2223/6655* (2013.01); *H01L 2223/6683* (2013.01); *H01L 2224/49107* (2013.01); *H01L 2924/13064* (2013.01); *H01L 2924/1421* (2013.01); *H01L 2924/30111* (2013.01)

(58) Field of Classification Search
CPC . H01L 23/04; H01L 29/2003; H01L 29/7786; H01L 23/047; H01L 23/66; H01L 23/4824; H01L 29/41775; H01L 29/41758; H01L 29/4175; H01L 29/41725; H01L 29/402; H01L 29/4238; H01L 24/09; H01L 23/552; H01L 29/0649; H01L 24/05; H01L 29/7816; H01L 23/5226; H01L 29/0696; H01L 29/778; H01L 21/823475; H01L 27/0207; H01L 23/5225; H01L 27/0203; H01L 29/404; H01L 21/76877; H01L 25/0657; H01L 25/105; H01L 27/0629; H01L 2224/0557; H01L 2224/133; H01L 2224/04026; H01L 2224/16225; H01L 2224/48195; H01L 2224/32235; H01L 2224/131; H01L 2224/49107; H01L 2223/6616; H01L 2224/1329; H01L 2924/13064; H01L 2924/1421; H01L 2224/2919; H01L 2223/6611; H01L 2223/6655; H01L 2224/3315; H01L 2224/73265; H01L 2224/0603; H01L 2224/0615; H01L 2224/05553; H01L 2924/30111; H01L 2223/6683; H01L 2224/291; H01L 2224/32245; H01L 2924/0665; H01L 2924/014; H01L 2924/00014; H01L 2224/49175; H01L 2224/48227; H01L 2223/6644; H01L 2224/49111; H01L 2224/48137; H01L 2224/48091; H01L 2224/73204; H01L 23/3128; H01L 2924/19041; H01L 2924/19105; H01L 2224/4811; H03F 3/195; H03F 1/0288; H03F 1/56; H03F 1/565; H03F 3/213; H03F 2200/222; H03F 2200/391; H03F 2200/387; H03F 2200/318; H03F 2200/451; H05K 1/181; H05K 7/023; H05K 1/111; H05K 2201/10015; H05K 2201/10166; H05K 2201/1003; H01G 4/38; H01G 4/005; H01G 4/12; H01G 4/30; H01G 4/385; H03H 7/38; H01F 27/2804
USPC ... 257/76, 77, 140, 195, 202, 204, 327, 368, 257/379, 390, 288, 401, 40, 9, 737, 522, 257/724, 23.021, 27.081, 21.158, 29.082, 257/29.255; 438/129, 121, 305, 302, 303, 438/605; 323/311; 327/594
See application file for complete search history.

(56) References Cited

U.S. PATENT DOCUMENTS

| | | |
|---|---|---|
| 9,786,660 B1 * | 10/2017 | Farrell ................ H01L 23/4824 |
| 9,807,882 B1 | 10/2017 | Berdy et al. |
| 10,438,894 B1 | 10/2019 | Farooq et al. |
| 10,855,244 B2 | 12/2020 | Trang et al. |
| 11,114,988 B2 | 9/2021 | Kim et al. |
| 11,521,957 B1 * | 12/2022 | Lee ................ H01L 29/7786 |
| 11,557,539 B1 * | 1/2023 | Romanczyk ........... H01L 23/36 |
| 11,587,852 B2 * | 2/2023 | Shilimkar ............ H01L 23/552 |
| 11,652,461 B2 | 5/2023 | Trang et al. |
| 11,735,538 B2 | 8/2023 | Radulescu |
| 2002/0179945 A1 * | 12/2002 | Sakamoto ......... H01L 29/41758 257/E29.022 |
| 2004/0238857 A1 | 12/2004 | Beroz et al. |
| 2008/0099800 A1 | 5/2008 | Miller et al. |
| 2009/0020848 A1 * | 1/2009 | Ono .................. H01L 29/42316 257/E29.001 |
| 2009/0091011 A1 | 4/2009 | Das et al. |
| 2010/0109052 A1 | 5/2010 | Nakajima et al. |
| 2011/0215472 A1 | 9/2011 | Chandrasekaran |
| 2011/0304013 A1 | 12/2011 | Chen et al. |
| 2011/0309372 A1 * | 12/2011 | Xin ..................... H01L 27/0629 257/E29.089 |
| 2012/0018892 A1 | 1/2012 | Soltan |
| 2012/0086497 A1 * | 4/2012 | Vorhaus .................. H03F 3/604 257/E29.089 |
| 2012/0299178 A1 | 11/2012 | Kanaya et al. |
| 2013/0168854 A1 | 7/2013 | Karikalan et al. |
| 2014/0014969 A1 * | 1/2014 | Kunii .................. H01L 27/0207 257/77 |
| 2014/0054604 A1 * | 2/2014 | Ritenour ............ H01L 21/0254 257/774 |
| 2014/0159118 A1 * | 6/2014 | Lenci .................... H01L 21/283 257/194 |
| 2014/0312458 A1 * | 10/2014 | Ashrafzadeh ........... H01L 25/16 257/532 |
| 2015/0171015 A1 | 6/2015 | Mahajan et al. |
| 2015/0171080 A1 * | 6/2015 | Vorhaus .............. H01L 27/0207 257/401 |
| 2016/0285418 A1 * | 9/2016 | Jones ..................... H01L 24/97 |
| 2017/0025349 A1 * | 1/2017 | Wood .................... H01L 23/544 |
| 2017/0053909 A1 * | 2/2017 | Laighton ............... H01L 29/812 |
| 2017/0062319 A1 * | 3/2017 | Guo .................... H01L 21/4846 |
| 2017/0110451 A1 * | 4/2017 | Fraser ..................... H01L 21/82 |
| 2017/0294528 A1 * | 10/2017 | Ren ........................ H01L 29/205 |
| 2018/0138132 A1 | 5/2018 | Nishizawa et al. |
| 2019/0097001 A1 * | 3/2019 | LaRoche ............ H01L 29/4175 |
| 2019/0131273 A1 | 5/2019 | Chen et al. |
| 2019/0148276 A1 | 5/2019 | Chen et al. |
| 2019/0199289 A1 * | 6/2019 | Wei ......................... H03F 3/195 |
| 2019/0304913 A1 | 10/2019 | Wu et al. |
| 2019/0356274 A1 | 11/2019 | Zhu et al. |
| 2020/0043946 A1 | 2/2020 | Paul et al. |
| 2020/0105741 A1 * | 4/2020 | Lin ....................... H01L 21/761 |
| 2020/0118922 A1 * | 4/2020 | Hill ....................... H01L 23/481 |
| 2020/0135766 A1 * | 4/2020 | Dutta .................. H01L 21/0254 |
| 2020/0168602 A1 * | 5/2020 | Kojima ............. H01L 29/42356 |
| 2020/0287536 A1 * | 9/2020 | Udrea .................. H03K 17/102 |
| 2020/0373892 A1 | 11/2020 | Kim et al. |
| 2021/0098408 A1 | 4/2021 | Ting et al. |
| 2021/0151428 A1 * | 5/2021 | Dutta .................... H01L 23/481 |
| 2021/0167199 A1 | 6/2021 | Sriram et al. |
| 2021/0202408 A1 * | 7/2021 | Khalil ..................... H03F 3/195 |
| 2021/0257472 A1 * | 8/2021 | Sato .................... H01L 29/4238 |
| 2021/0398971 A1 * | 12/2021 | Som .................... H01L 27/0617 |
| 2022/0020874 A1 * | 1/2022 | Fisher ................ H01L 29/0696 |
| 2022/0044986 A1 * | 2/2022 | Khalil .................... H01L 24/06 |
| 2022/0190126 A1 * | 6/2022 | Kabir .................. H01L 29/4238 |

FOREIGN PATENT DOCUMENTS

| | | |
|---|---|---|
| TW | 201810673 A | 3/2018 |
| TW | 201813016 A | 4/2018 |
| TW | 202013658 A | 4/2020 |
| WO | 2019132941 A1 | 7/2019 |

OTHER PUBLICATIONS

"Notification of Transmittal of the International Search Report and the Written Opinion of the International Searching Authority, or the

(56) References Cited

OTHER PUBLICATIONS

Declaration for corresponding International Application No. PCT/US2022/023916, dated Jun. 30, 2021, (13 pages)".
"Qin Zheng et al: "Electrical simulation of thin film inductors on silicon and glass substrates", 2014 Joint IEEE International Symposium , IEEE, May 12, 2014, pp. 555-559".
Notification of Transmittal of the International Search Report and the Written Opinion of the International Searching Authority, or the Declaration, in corresponding PCT Application No. PCT/US2021/021848 (dated Jun. 13, 2021).
"Indian Examination Report in Corresponding Patent Application No. 202247061172, dated Jan. 2, 2023, 4 pages".
"Indian Examination Report in Corresponding Patent Application No. 202247061192, dated Dec. 28, 2022, 5 pages".
Notification of Transmittal of the International Search Report and the Written Opinion of the International Searching Authority, or the Declaration, in corresponding PCT Application No. PCT/US2021/024623 (dated Jul. 16, 2021).
"Taiwan Office Action in Corresponding Patent Application No. 110112239, dated Mar. 9, 2023, 6 pages".

\* cited by examiner

GROUP III NITRIDE-BASED RADIO FREQUENCY AMPLIFIERS HAVING BACK SIDE SOURCE, GATE AND/OR DRAIN TERMINALS

CROSS-REFERENCE TO RELATED APPLICATION

The present application claims priority under 35 U.S.C. § 119 to U.S. Provisional Patent Application Ser. No. 63/004,962, filed Apr. 3, 2020, the entire content of which is incorporated herein by reference.

FIELD

The present invention relates to microelectronic devices and, more particularly, to Group III nitride-based radio frequency ("RF") amplifiers.

BACKGROUND

RF amplifiers are widely used in cellular communications systems and other applications. RF amplifiers are typically formed as semiconductor integrated circuit chips. Most RF amplifiers are implemented in silicon or using wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF amplifiers are typically implemented using laterally diffused metal oxide semiconductor ("LDMOS") transistors. Silicon LDMOS RF amplifiers can exhibit high levels of linearity and may be relatively inexpensive to fabricate. Group III nitride-based RF amplifiers are typically implemented using High Electron Mobility Transistors ("HEMT") and are primarily used in applications requiring high power and/or high frequency operation where LDMOS transistor amplifiers may have inherent performance limitations.

RF amplifiers may include one or more amplification stages, with each stage typically implemented as a transistor amplifier. In order to increase the output power and current handling capabilities, RF amplifiers are typically implemented in a "unit cell" configuration in which a large number of individual "unit cell" transistors are arranged electrically in parallel. The RF amplifier may be implemented as a single integrated circuit chip or "die," or may include a plurality of dies. When multiple RF amplifier die are used, they may be connected in series and/or in parallel.

RF amplifiers often include matching circuits, such as impedance matching circuits, that are designed to improve the impedance match between an RF amplifier die and transmission lines connected thereto for RF signals at the fundamental operating frequency and harmonic termination circuits that are designed to at least partly terminate harmonics that may be generated during device operation such as second and third order harmonics. The RF amplifier die(s) as well as the impedance matching and harmonic termination circuits may be enclosed in a package. Electrical leads may extend from the package that are used to electrically connect the RF amplifier to external circuit elements such as input and output RF transmission lines and bias voltage sources.

As noted above, Group III nitride-based RF amplifiers are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal. FIGS. 1A and 1B illustrate a conventional packaged Group III nitride-based RF amplifier. In particular, FIG. 1A is a schematic side view of a conventional packaged Group III nitride-based RF amplifier 100, and FIG. 1B is a schematic cross-sectional view of the RF transistor amplifier die that is included in the packaged Group III nitride-based RF transistor amplifier 100, where the cross-section is taken along line 1B-1B of FIG. 1A. It will be appreciated that FIGS. 1A-1B (and various of the other figures) are highly simplified diagrams and that actual RF amplifiers may include many more unit cells and various circuitry and elements that are not shown in the simplified figures herein.

As shown in FIG. 1A, the Group III nitride-based RF amplifier 100 includes an RF amplifier die 110 that is mounted within an open cavity package 170. The package 170 includes a gate lead 172, a drain lead 174, a metal flange 176 and a ceramic sidewall and lid 178. The RF transistor amplifier die 110 is mounted on the upper surface of the metal flange 176 in a cavity formed by the metal flange 176 and the ceramic sidewall and lid 178. The RF amplifier die 110 has a top side 112 and a bottom side 114. The RF amplifier die 110 includes a bottom side (also referred to as a "back" side) metallization structure 120, a semiconductor layer structure 130 and a top side metallization structure 140 that are sequentially stacked. The back side metallization structure 120 comprises a source terminal 126. The RF amplifier 100 may be a HEMT-based RF amplifier, in which case the semiconductor layer structure 130 may include at least a channel layer and a barrier layer, which are typically formed on a semiconductor or insulating growth substrate (such as a SiC or sapphire substrate). The top side metallization structure 140 includes, among other things, a gate terminal 142 and a drain terminal 144.

Input matching circuits 190 and/or output matching circuits 192 may also be mounted within the housing 170. The matching circuits 190, 192 may be impedance matching circuits that match the impedance of the fundamental component of RF signals input to or output from the RF transistor amplifier 100 to the impedance at the input or output of the RF transistor amplifier die 110, respectively, and/or harmonic termination circuits that are configured to short to ground harmonics of the fundamental RF signal that may be present at the input or output of the RF transistor amplifier die 110, such as second order or third order harmonics. As schematically shown in FIG. 1A, the input and output matching circuits 190, 192 may be mounted on the metal flange 176. The gate lead 172 may be connected to the input matching circuit 190 by one or more first bond wires 182, and the input matching circuit 190 may be connected to the gate terminal 142 of RF amplifier die 110 by one or more second bond wires 183. Similarly, the drain lead 174 may be connected to the output matching circuit 192 by one or more fourth bond wires 185, and the output matching circuit 192 may be connected to the drain terminal 144 of RF amplifier die 110 by one or more third bond wires

184. The source terminal 126 of RF transistor amplifier die 110 may be mounted directly on the metal flange 176. The metal flange 176 may provide the electrical connection to the source terminal 126 and may also serve as a heat dissipation structure. The first through fourth bond wires 182-185 may form part of the input and/or output matching circuits. The gate lead 172 and the drain lead 174 may extend through the ceramic sidewalls 178. The housing may comprise multiple pieces, such as a frame that forms the lower portion of the sidewalls and supports the gate and drain leads 172, 174, and a lid that is placed on top of the frame. The interior of the device may comprise an air-filled cavity.

FIG. 1B is a schematic cross-sectional view of the RF amplifier die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the RF amplifier die 110 comprises a Group III nitride-based HEMT RF amplifier that has a plurality of unit cell transistors 116 that each include a gate finger 152, a drain finger 154 and a source finger 156. The gate fingers 152 are electrically connected to a common gate bus 146, and the drain fingers 154 are electrically connected to a common drain bus 148. The gate bus 146 is electrically connected to the gate terminal 142 (e.g., through a conductive via that extends upwardly from the gate bus 146) which is implemented as a gate bond pad (see FIG. 1A), and the drain bus 148 is electrically connected to the drain terminal 144 (e.g., through a conductive via that extends upwardly from the drain bus 148) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may comprise metal-plated vias that extend completely through the semiconductor layer structure 130.

Referring again to FIG. 1A, the metal flange 176 may act as a heat sink that dissipates heat that is generated in the RF amplifier die 110. The heat is primarily generated in the upper portion of the RF amplifier die 110 where relatively high current densities are generated in, for example, the channel regions of the unit cell transistors 116. This heat may be transferred though both the source vias 166 and the semiconductor layer structure 130 to the metal flange 176.

FIG. 1C is a schematic side view of a conventional packaged Group III nitride-based RF transistor amplifier 100' that is similar to the RF transistor amplifier discussed above with reference to FIG. 1A. RF transistor amplifier 100' differs from RF transistor amplifier 100 in that it includes a different package 170'. The package 170' includes a metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. RF transistor amplifier 100' also includes a plastic overmold 178' that at least partially surrounds the RF transistor amplifier die 110, the leads 172', 174' and the metal submount 176. The plastic overmold 178' replaces the ceramic sidewalls and lid 178 included in RF transistor amplifier 100.

Depending on the embodiment, the packaged transistor amplifier 100' can include, for example, a monolithic microwave integrated circuit (MMIC) as the RF transistor amplifier die 110 in which case the RF transistor amplifier die 110 incorporates multiple discrete devices. Examples of such Group III nitride-based RF amplifiers are disclosed, for example, in U.S. Pat. No. 9,947,616, the entire content of which is incorporated herein by reference. When the RF transistor amplifier die 110 is a MMIC implementation, the input matching circuits 190 and/or the output matching circuits 192 may be omitted (since they may instead be implemented within the RF transistor amplifier die 110) and the bond wires 182 and/or 185 may extend directly from the gate and drain leads 172', 174' to the gate and drain terminals 142, 144. In some embodiments, the packaged RF transistor amplifier 100 can include multiple RF transistor amplifier die that are connected in series to form a multiple stage RF transistor amplifier and/or may include multiple transistor die that are disposed in multiple paths (e.g., in parallel) to form an RF transistor amplifier with multiple RF transistor amplifier die and multiple paths, such as in a Doherty amplifier configuration

SUMMARY

Pursuant to embodiments of the present invention, RF amplifiers are provided that include an interconnection structure interconnection structure and a Group III nitride-based RF amplifier die that is mounted on top of the interconnection structure. The Group III nitride-based RF amplifier die including a semiconductor layer structure and a gate terminal, a source terminal and a drain terminal on the semiconductor layer structure. A plurality of unit cell transistors are provided in an upper portion of the semiconductor layer structure, and at least two of the gate terminals, the drain terminal and the source terminal are provided on a lower surface of the semiconductor layer structure that is adjacent the interconnection structure.

In some embodiments, the drain terminal may be electrically connected to the unit cell transistors through one or more conductive drain vias and/or the gate terminal may be electrically connected to the unit cell transistors through one or more conductive gate vias.

In some embodiments, the semiconductor layer structure may include at least a growth substrate, a channel layer and a barrier layer, where the channel layer is between the growth substrate and the barrier layer. In some embodiments, the Group III nitride-based RF amplifier die further includes a metallization structure that comprises a plurality of gate fingers, a plurality of drain fingers and a plurality of source fingers that are on barrier layer opposite the channel layer. In these embodiments, the gate fingers may be electrically connected to the gate terminal via the one or more conductive gate vias, and the drain fingers may be electrically connected to the drain terminal via the one or more conductive drain vias.

In some embodiments, the one or more conductive gate vias and the one or more conductive drain vias may be metal-plated vias that extend through the semiconductor layer structure or that at least extend through the growth substrate.

In some embodiments, the interconnection structure may include a gate pad that is electrically connected to the gate terminal, a drain pad that is electrically connected to the drain terminal and a source pad that is electrically connected to the source terminal. The gate pad, the drain pad and the source pad may be electrically connected to the gate terminal, the drain terminal and the source terminal, respectively, via contacts such as a conductive epoxy pattern or solder bumps in example embodiments.

In some embodiments, the gate terminal may overlap the gate pad along a first axis that is perpendicular to an upper surface of the interconnection structure, the drain terminal may overlap the drain pad along a second axis that is perpendicular to an upper surface of the interconnection structure, and/or the source terminal may overlap the source pad along a third axis that is perpendicular to an upper surface of the interconnection structure.

In some embodiments, the one or more conductive gate vias, the one or more conductive drain vias and the one or more conductive source vias may all have substantially a same shape and substantially a same cross-sectional area.

In some embodiments, the interconnection structure may include at least a first portion of a matching circuit. In some embodiments, the one or more conductive gate vias may comprise a second portion of the matching circuit.

Pursuant to further embodiments of the present invention, RF amplifiers are provided that include an interconnection structure that has a gate pad that is connected to an input matching circuit, a drain pad that is connected to an output matching circuit, and a source pad that is coupled to a heat dissipation structure. These RF amplifiers also include a Group III nitride-based RF amplifier die that is mounted on the interconnection structure. The Group III nitride-based RF amplifier die includes a semiconductor layer structure, a gate terminal on a first side of the semiconductor layer structure that overlaps the gate pad along a first axis that is perpendicular to an upper surface of the interconnection structure, a drain terminal on the first side of the semiconductor layer structure that overlaps the drain pad along a second axis that is perpendicular to an upper surface of the interconnection structure, a source terminal on the first side of the semiconductor layer structure that overlaps the source pad along a third axis that is perpendicular to an upper surface of the interconnection structure, a conductive gate via that is electrically connected to the gate terminal that extends from a second side of the semiconductor layer structure to the first side of the semiconductor layer structure, and a conductive drain via that is electrically connected to the drain terminal that extends from the second side of the semiconductor layer structure to the first side of the semiconductor layer structure.

In some embodiments, the Group III nitride-based RF amplifier die may further include a plurality of gate fingers, drain fingers and source fingers that are on the second side of the semiconductor layer structure, and at least some of the gate fingers may electrically connected to the gate terminal via the conductive gate via, and at least some of the drain fingers may be electrically connected to the drain terminal via the conductive drain via.

In some embodiments, the gate pad, the drain pad and the source pad may be electrically connected to the gate terminal, the drain terminal and the source terminal, respectively, via a conductive epoxy pattern.

In some embodiments, the RF amplifier die may further include a conductive source via that is electrically connected to the source terminal that extends from the second side of the semiconductor layer structure to the first side of the semiconductor layer structure.

In some embodiments, the conductive gate via, the conductive drain via and the conductive source via may all have substantially a same shape and substantially a same cross-sectional area.

Pursuant to still further embodiments of the present invention, RF amplifiers are provided that include a Group III nitride-based RF amplifier die. The Group III nitride-based RF amplifier die includes a semiconductor layer structure that includes a channel layer and a barrier layer on the channel layer, a gate terminal, a drain terminal, a source terminal, a plurality of gate fingers that are electrically connected to the gate terminal via at least one conductive gate via, a plurality of drain fingers that are electrically connected to the drain terminal via at least one conductive drain via, and a plurality of source fingers that are electrically connected to the source terminal via at least one conductive source via. The gate fingers, the drain fingers and the source fingers are all on a first side of the semiconductor layer structure. Additionally, the gate terminal, the drain terminal and the source terminal are all on a second side of the semiconductor layer structure that is opposite the first side.

In some embodiments, the semiconductor layer structure may further include a growth substrate, and the channel layer may be between the growth substrate and the barrier layer.

In some embodiments, the at least one conductive gate via and the at least one conductive drain via may extend completely through the growth substrate.

In some embodiments, the at least one conductive gate via and the at least one conductive drain via may each comprise metal-plated vias that extend completely through the semiconductor layer structure.

In some embodiments, the RF amplifier may further include an interconnection structure that includes a gate pad that is electrically connected to the gate terminal, a drain pad that is electrically connected to the drain terminal and a source pad that is electrically connected to the source terminal.

In some embodiments, the gate pad, the drain pad and the source pad may be electrically connected to the gate terminal, the drain terminal and the source terminal, respectively, via a conductive epoxy pattern.

Pursuant to still other embodiments of the present invention, a Group III nitride-based RF amplifier die is provided that includes a semiconductor layer structure that has a top side and a bottom side that is opposite the top side, a plurality of gate fingers on the top side of the semiconductor layer structure, and a gate terminal, a drain terminal and a source terminal on the bottom side of the semiconductor layer structure.

In some embodiments, the Group III nitride-based RF amplifier die may further include a plurality of drain fingers on the top side of the semiconductor layer structure, a plurality of source fingers on the top side of the semiconductor layer structure, one or more conductive gate vias, one or more conductive drain vias, and one or more conductive source vias. The gate terminal may be electrically connected to the plurality of gate fingers through the one or more conductive gate vias, the drain terminal may be electrically connected to the plurality of drain fingers through the one or more conductive drain vias, and the source terminal may be electrically connected to the plurality of source fingers through the one or more conductive source vias.

In some embodiments, the semiconductor layer structure may comprise a growth substrate, a channel layer and a barrier layer, where the channel layer is between the growth substrate and the barrier layer, and the one or more conductive gate vias, the one or more conductive drain vias and the one or more conductive source vias may extend completely through the growth substrate.

DETAILED DESCRIPTION

Figure 1A:
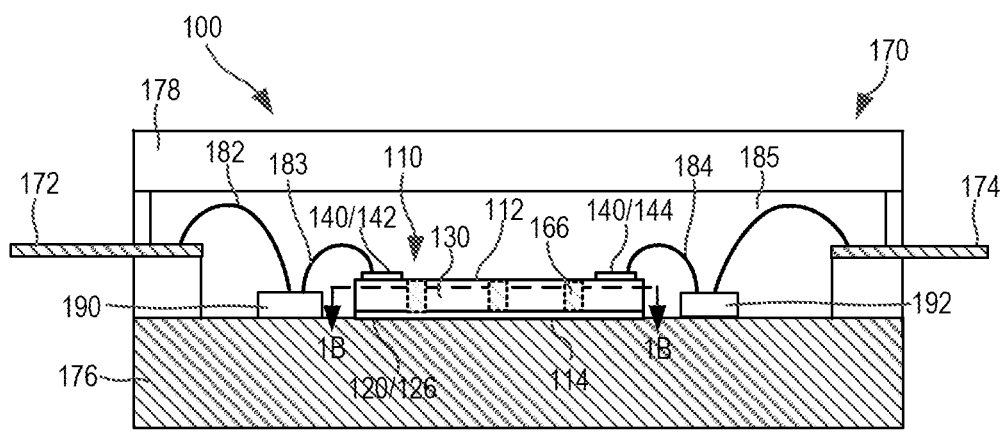
FIG. 1A is a schematic side view of a conventional Group III nitride-based RF amplifier.
Figure 1B:
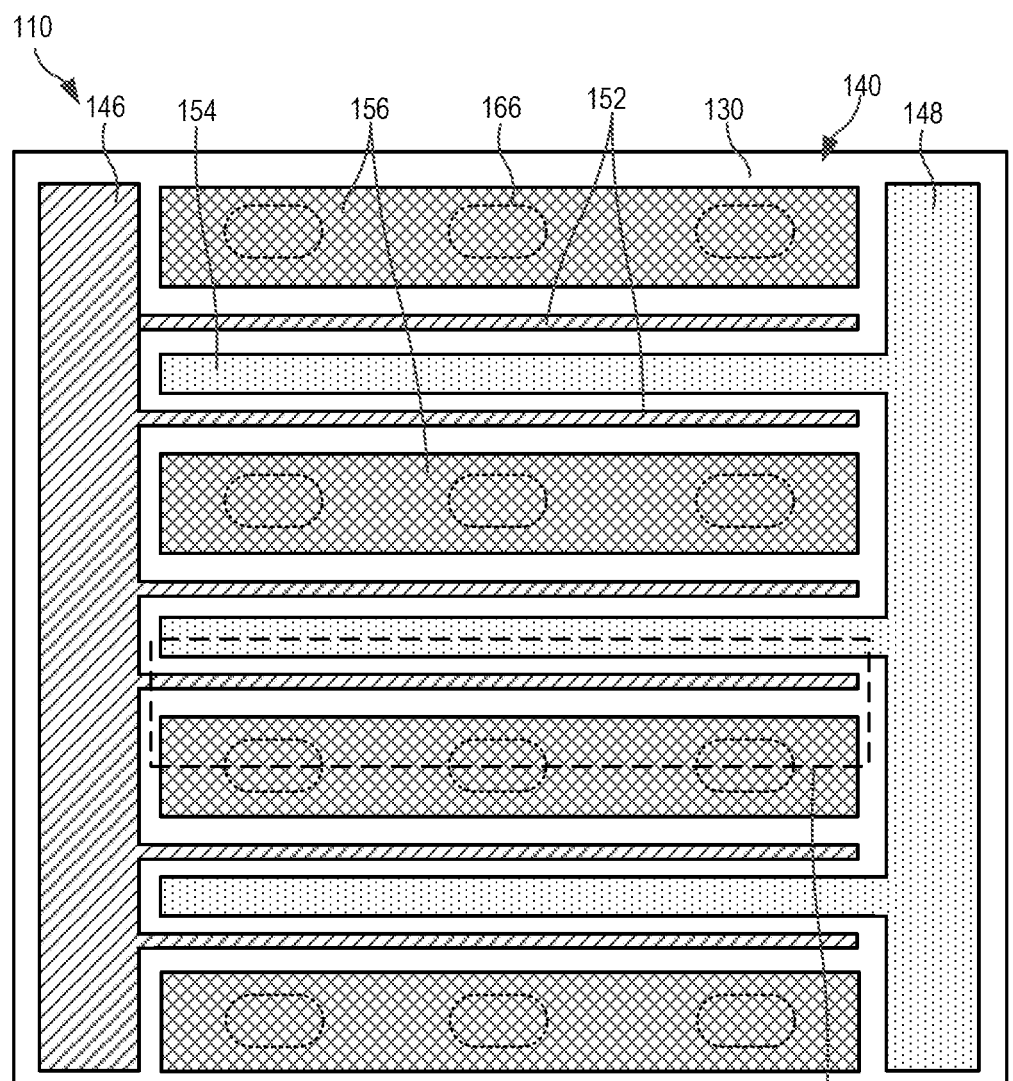
FIG. 1B is a schematic cross-sectional view taken along line 1B-1B of FIG. 1A that shows the structure of the top metallization of an RF amplifier die that is included in the RF amplifier of FIG. 1A.

Conventional Group III nitride-based RF amplifiers, such as the RF amplifier 100 of FIGS. 1A-1B, may use bond wires to connect the RF amplifier die 110 to gate and drain leads 172, 174. These bond wires have inherent inductance that may be used to implement some of the inductors in the impedance matching and/or harmonic termination circuits of the RF amplifiers. The amount of inductance provided may be varied by changing the length and/or the cross-sectional area (e.g., the diameter) of the bond wires so that the bond wires provide a desired amount of inductance. Unfortunately, as applications move to higher frequencies, the inductance of the bond wires may exceed a desired amount of inductance for the impedance matching and/or harmonic termination circuits. When this occurs, bond wires that are very short and/or that have large cross-sectional areas may be used in an effort to decrease the inductance thereof to suitable levels. Very short bond wires, however, may be difficult to solder in place, which may increase manufacturing costs, and/or may result in higher device failure rates. Bond wires having large cross-sectional areas may require larger gate and drain bond pads on the RF amplifier die, which require an increase in the overall size of the RF amplifier die, which is also undesirable. Moreover, in some higher frequency applications, even very short bond wires having large cross-sectional areas may have too much inductance such that the matching networks cannot, for example, properly terminate the second or third order harmonics. While the RF amplifiers may be implemented as MMIC devices in order to avoid the problem of too much inductance in the bond wires, MMIC RF amplifiers are more expensive to fabricate and can only be used in a narrow frequency range, reducing flexibility.

Figure 1C:
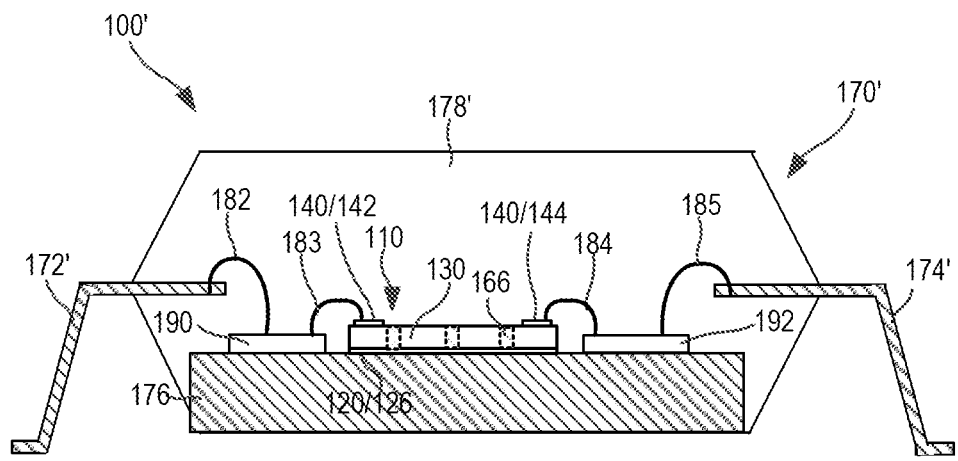
FIG. 1C is a schematic side view of another conventional Group III nitride-based RF transistor amplifier.

Pursuant to embodiments of the present invention, Group III nitride-based RF amplifiers are provided that include RF amplifier dies that have their gate terminals, drain terminals and source terminals all located on the back side of the RF amplifier die. The gate, drain and source terminals may all be connected to corresponding gate, drain and source pads on an interconnection structure using bump technology, such as solder bumps, a conductive epoxy or other low inductance electrical connections without any need for the bond wires that are included in the conventional RF amplifiers of FIGS. 1A-1C. The RF amplifier die may include one or more gate vias and/or one or more drain vias that are used to connect a gate bus and/or a drain bus that are on the top side of the RF amplifier die to the respective gate and drain terminals that are on the back side of the RF amplifier die. The length of the conductive vias may be a small fraction (e.g., 10-30%) of the length of conventional bond wires, and hence the inductance of the connections between the gate and drain buses and the interconnection structure may be reduced significantly. As a result, the impedance matching and/or harmonic termination circuits may be configured to have a desired amount of inductance without the need for implementing the RF amplifier as a MMIC device. Thus, the size of the RF amplifier dies may be reduced without compromising the performance thereof, and the RF amplifier dies can be used for applications in a variety of different frequency bands, as the frequency-specific portions of the device may be implemented on separate chips or circuits.

Moreover, the wire bonding equipment that is typically used for high volume manufacturing may have a tolerance of +/−1 mil, meaning that the length of any particular wire bond may vary by as much as 4 mils. For high frequency applications, the variation in inductance associated with 4 mils of wire bond may be significant, and hence the performance of the matching circuits may be degraded if the bond wires are 1-2 mils too short or long from a desired nominal length. Forming the gate and drain terminals on the back side of the device and using bump technology to connect these terminals to corresponding pads on the interconnection structure may eliminate this process variation, resulting in improved performance.

Pursuant to some embodiments of the present invention, RF amplifiers are provided that include an interconnection structure and a Group III nitride-based RF amplifier die that is mounted on top of the interconnection structure. The Group III nitride-based RF amplifier die includes a semiconductor layer structure. A plurality of unit cell transistors are provided in an upper portion of the semiconductor layer structure, and a gate terminal, a drain terminal and a source terminal are provided on a lower surface of the semiconductor layer structure that is adjacent the interconnection structure. The gate terminal is electrically connected to the unit cell transistors through one or more conductive gate vias, the drain terminal is electrically connected to the unit cell transistors through one or more conductive drain vias, and the source terminal is electrically connected to the unit cell transistors through one or more conductive source vias. The gate vias, drain vias and source vias may extend completely through the semiconductor layer structure.

The unit cell transistors may be HEMT devices, and each unit cell transistor may include a growth substrate, a channel layer and a barrier layer. The channel layer is between the growth substrate and the barrier layer. The RF amplifier die may further include a top metallization structure that comprises a plurality of gate fingers, a plurality of drain fingers and a plurality of source fingers that are on barrier layer opposite the channel layer. The gate fingers may be electrically connected to the gate terminal via the one or more conductive gate vias, and the drain fingers may be electrically connected to the drain terminal via the one or more conductive drain vias. The conductive gate via(s) and the conductive drain via(s) may be metal-plated vias that extend through the semiconductor layer structure or that at least extend through the growth substrate.

The interconnection structure may include a gate pad that is electrically connected to the gate terminal, a drain pad that is electrically connected to the drain terminal and a source pad that is electrically connected to the source terminal. The gate pad, the drain pad and the source pad may be electrically connected to the gate terminal, the drain terminal and the source terminal, respectively, via a conductive epoxy pattern or solder bumps in example embodiments. In some embodiments, the interconnection structure may include at least a first portion of a matching circuit. The one or more conductive gate vias may comprise a second portion of the matching circuit.

Embodiments of the present invention will now be discussed in further detail with reference to the accompanying figures.

Figure 2A:
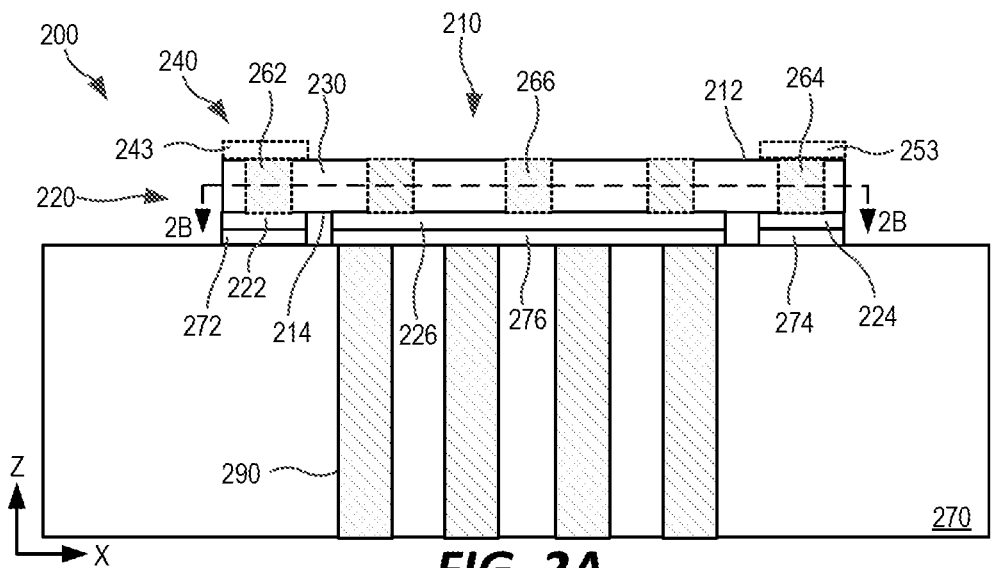
FIG. 2A is a schematic side view of a Group III nitride-based RF amplifier according to embodiments of the present invention.
Figure 2B:
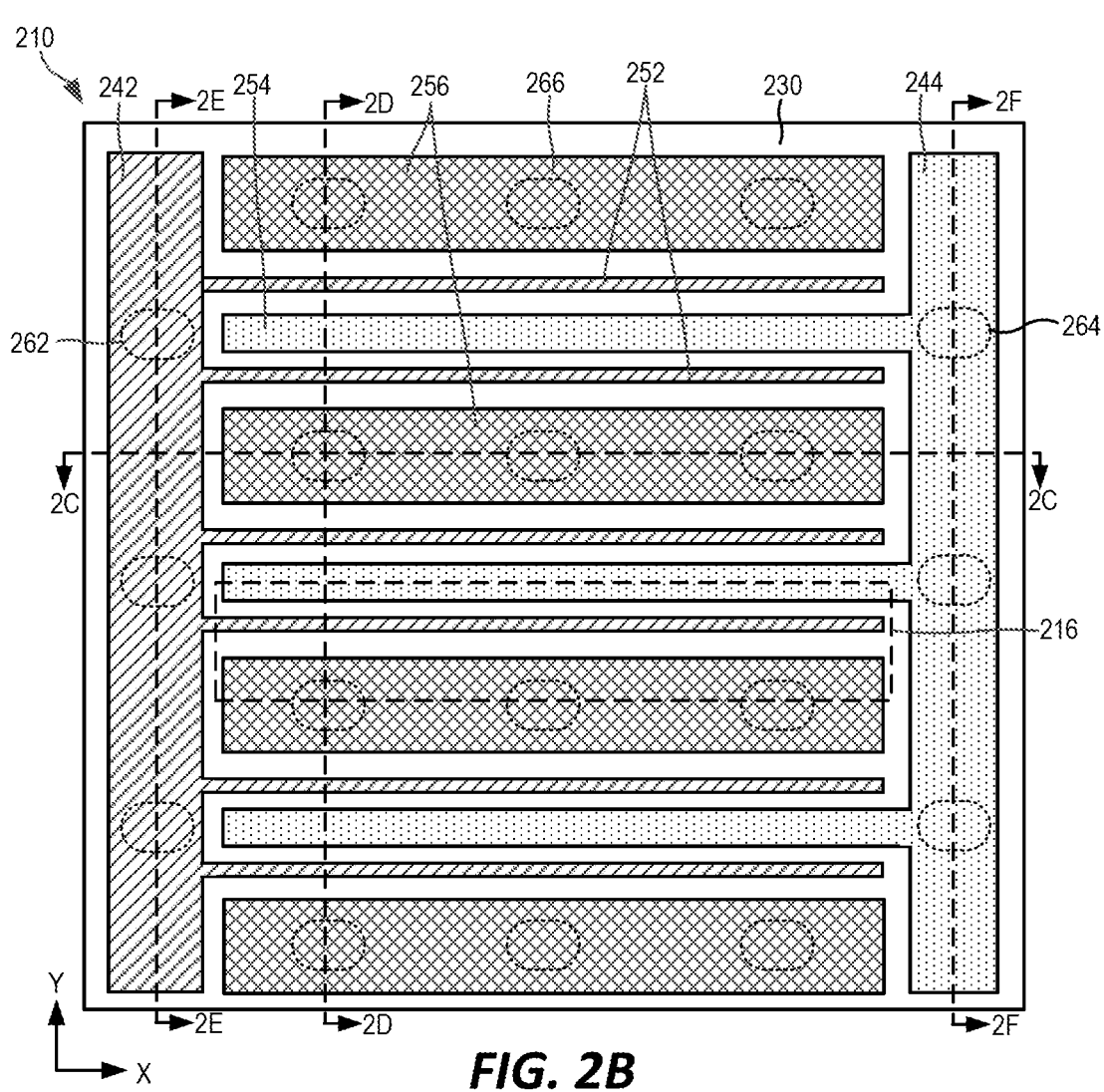
FIG. 2B is a schematic cross-sectional view taken along line 2B-2B of FIG. 2A that shows the structure of the top metallization of an RF amplifier die that is included in the RF amplifier of FIG. 2A.

FIGS. 2A-2F depict a Group III nitride-based RF amplifier 200 according to certain embodiments of the present invention. In particular, FIG. 2A is a schematic side view of the Group III nitride-based RF amplifier 200. FIG. 2B is a schematic cross-sectional view of an RF amplifier die 210 that is part of the Group III nitride-based RF amplifier 200 of FIG. 2A that is taken along line 2B-2B of FIG. 2A. FIGS. 2C through 2F are schematic cross-sectional views of the RF amplifier die 210 that are taken along lines 2C-2C through 2F-2F of FIG. 2B, respectively. FIG. 2G is a schematic bottom view of the RF amplifier die 210. Finally, FIG. 2H is a circuit diagram of the Group III nitride-based RF amplifier 200.

As shown in FIG. 2A, the Group III nitride-based RF amplifier 200 includes an RF amplifier die 210 that is mounted on the upper surface of an interconnection structure 270. The RF amplifier die 210 has a top side 212 and a bottom or side 214. The RF amplifier die 210 includes a bottom side metallization structure 220, a semiconductor layer structure 230, and a top side metallization structure 240 that are sequentially stacked. The bottom side metallization structure 220 comprises a gate terminal 222, a drain terminal 224, and a source terminal 226. The RF amplifier 200 may be a HEMT-based RF amplifier, in which case the semiconductor layer structure 230 may include at least a channel layer and a barrier layer, as will be discussed in greater detail with reference to FIGS. 2C and 2D. The top side metallization structure 240 will be discussed in greater detail with reference to FIG. 2B.

The interconnection structure 270 may comprise, for example, a printed circuit board (e.g., a multi-layer printed circuit board), a metal core printed circuit board, a redistribution layer ("RDL") laminate substrate, an interposer, a metal flange or a ceramic substrate that includes conductive vias and/or pads. In other embodiments, the interconnection structure 270 may comprise a metal flange that has an insulating pattern (e.g., a solder mask) on a top surface thereof, and conductive traces on the insulating layer that, for example, provide electrical connections to the gate terminal 222 and the drain terminal 224. More generally, the interconnection structure 270 may comprise any suitable mounting surface for the RF amplifier die 210 that can make electrical connections to the back side 214 of the RF amplifier die 210. More than one interconnection structure 270 may be provided in a stacked manner. The RF transistor amplifier die 210 may be mounted on the interconnection structure 270 by the die manufacturer and packaged in any suitable package.

A gate pad 272, a drain pad 274 and a source pad 276 are provided on the top surface of the interconnection structure 270. In some embodiments, the interconnection structure 270 may include pads 272, 274, 276 that may comprise, for example, exposed copper pads on the top surface of the interconnection structure 270. The gate terminal 222 may overlap the gate pad 272 along a first vertical axis that extends perpendicular to the top surface of the semiconductor layer structure, the drain terminal 224 may overlap the drain pad 274 along a second vertical axis that extends perpendicular to the top surface of the semiconductor layer structure, and the source terminal 226 may overlap the source pad 276 along a third vertical axis that extends perpendicular to the top surface of the semiconductor layer structure. By "overlap" it is meant that the axis extends through both the terminal and its corresponding pad, and "vertical" refers to a direction that is perpendicular to a major surface of the semiconductor layer structure 230. Each overlapping terminal and pad (e.g., gate terminal 222 and gate pad 272) may be physically and electrically connected to each other by any suitable means including, for example, a conductive epoxy, a solder joint or the like. It will be appreciated that any type of bump grid array technology may be used to connect the gate, drain and source terminals 222, 224, 226 to the respective gate, drain and source pads 272, 274, 276 while facilitating dissipation of heat from the RF amplifier die 210. The interconnection structure 270 further includes a plurality of heat dissipation structures 290. In the depicted embodiment, the heat dissipation structures 290 comprise metal-filled vias that extend through the interconnection structure 270. Heat that is generated in the RF amplifier die 210 may be dissipated through the metal-filled vias 290. The interconnection structure may also include a plurality of conductive traces (not shown) and/or conductive vias (not shown) that may act as RF signal-carrying paths, as will be discussed in detail herein.

The RF amplifier die 210 comprises a Group III nitride-based HEMT RF amplifier that includes a plurality of unit cell transistors 216 that are electrically connected to each other in parallel. This can best be seen in FIG. 2B, which schematically depicts the top side metallization structure 240 of RF amplifier die 210. As shown in FIG. 2B, the top side metallization structure 240 includes a gate bus 242 and a drain bus 244, a plurality of gate fingers 252, a plurality of drain fingers 254 and a plurality of source fingers 256, all of which may be formed on an upper surface of the semiconductor layer structure 230. The gate bus 242 and the gate fingers 252 may be implemented as a first monolithic metal pattern, and the drain bus 244 and the drain fingers 254 may be implemented as a second monolithic metal pattern. The gate fingers 252 may be formed of materials that are capable of making a Schottky contact to a Group III nitride-based semiconductor material, such as Ni, Pt, Cu, Pd, Cr, W and/or WSiN. The drain fingers 254 and source fingers 256 may include a metal, such as TiAlN, that can form an ohmic contact to Group III nitride-based materials. A dielectric layer (or a series of dielectric layers) that help isolate the gate metallization 242, 252, the drain metallization 244, 254 and the source metallization 256 from each other is not shown in FIG. 2B to better illustrate the elements of the top side metallization structure 240. A conductive gate bond pad 243 and/or a conductive drain bond pad 253 may optionally be provided on the upper surface of the RF transistor amplifier die 210. The gate bond pad 243 may be electrically connected to the gate terminal 222, and the drain bond pad 253 may be electrically connected to the drain terminal 224.

One of the unit cell transistors 216 is also shown in FIG. 2B. As shown, the unit cell transistor 216 includes a gate finger 252, a drain finger 254 and a source finger 256 along with the underlying portion of the semiconductor layer structure 230. Since all of the gate fingers 252 are electrically connected to a common gate bus 242, all of the drain fingers 254 are electrically connected to a common drain bus 244, and all of the source fingers 256 are electrically connected together via the source pad 226, it can be seen that the unit cell transistors 216 are all electrically connected together in parallel.

The unit cell transistors 216 may by HEMT devices. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

As is further shown in FIG. 2B, a plurality of metal-plated vias are provided that extend from the top metallization structure 240 through the semiconductor layer structure 230. The metal-plated vias include metal-plated gate vias 262, metal-plated drain vias 264, and metal-plated source vias 266. The metal-plated gate vias 262 physically and electrically connect the gate bus 242 to the gate terminal 222, the metal-plated drain vias 264 physically and electrically connect the drain bus 244 to the drain terminal 224, and metal-plated source vias 262 physically and electrically connect the source fingers 256 to the source terminal 226.

As is further shown in FIG. 2B, the conductive gate vias 262 and/or the conductive drain vias 264 may be offset (in the Y-direction of FIG. 2B) from the conductive source vias 266. In particular, two or more conductive source vias 266 may be formed in each source finger 256, and the conductive source vias 266 that are formed in a particular source finger 256 may extend (at least generally) along a horizontal (X-direction) axis. Thus, the conductive source vias 266 included in each source finger 256 may define respective horizontal axes in the view of FIG. 2B, with line 2C-2C in FIG. 2B illustrating one such horizontal axis. As shown in FIG. 2B, the conductive gate vias 262 and/or the conductive drain vias 264 may be positioned between these horizontal axes (as opposed to, for example, being aligned along these horizontal axes). In some cases, the conductive gate vias 262 and/or the conductive drain vias 264 may be positioned along the longitudinal axes defined by the respective drain fingers 254. Offsetting the conductive gate vias 262 and the conductive drain vias 264 from the conductive source vias 266 may increase the distance between conductive vias, 262, 264, 266, which can reduce the possibility that the wafer or die cracks due to mechanical weaknesses. This arrangement also reduces parasitic gate-to-source and/or parasitic source-to-drain coupling that may occur between the various vias 262, 264, 266. Such parasitic coupling may lead to gain loss and/or instability.

Figure 2C:
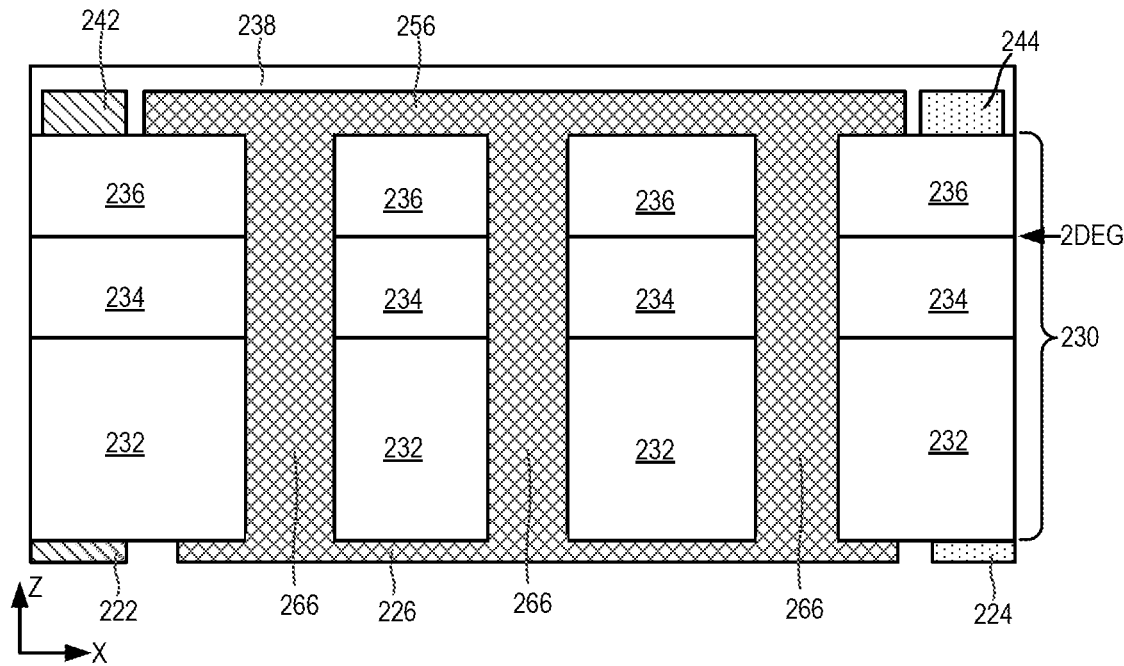
FIG. 2C is a cross-sectional view taken along line 2C-2C of FIG. 2B.
Figure 2D:
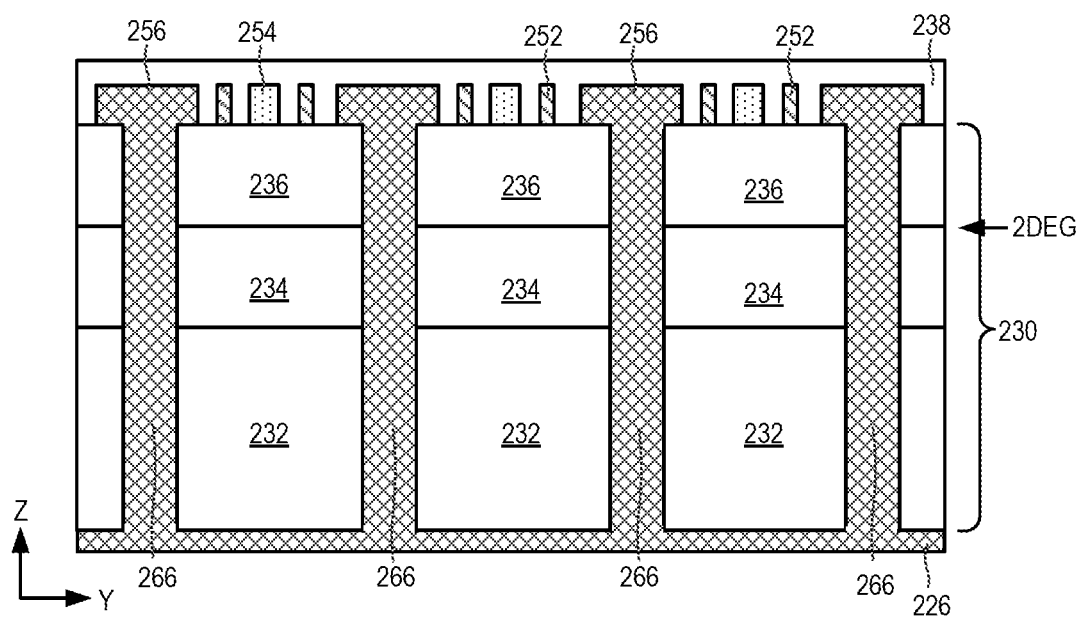
FIG. 2D is a cross-sectional view taken along line 2D-2D of FIG. 2B.
Figure 2E:
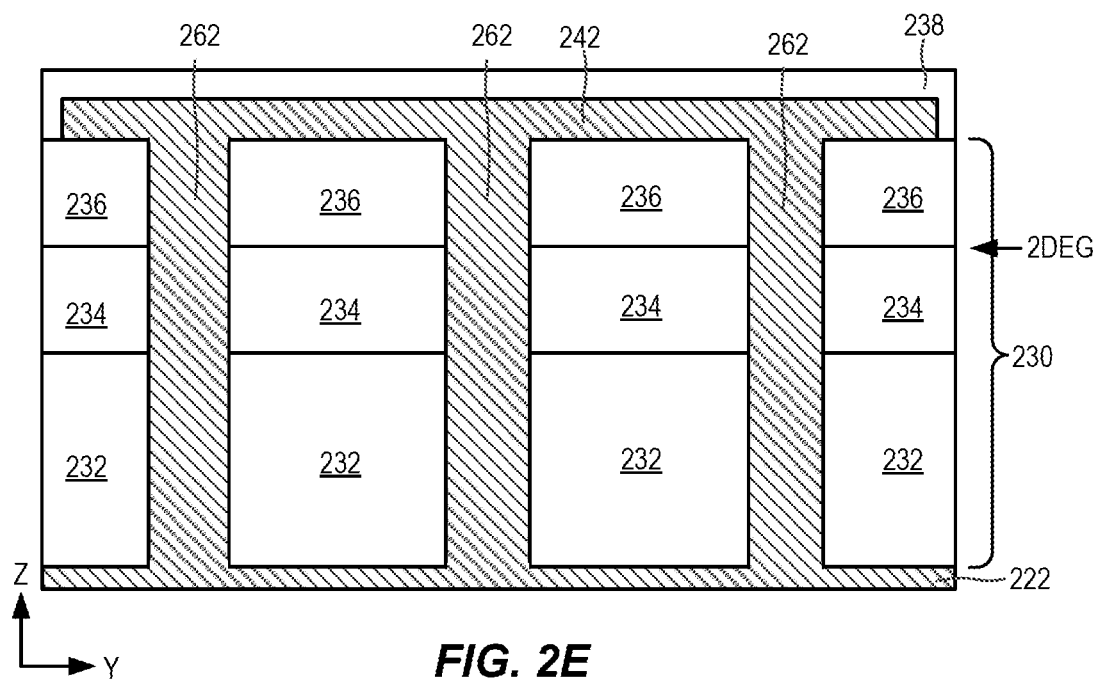
FIG. 2E is a cross-sectional view taken along line 2E-2E of FIG. 2B.
Figure 2F:
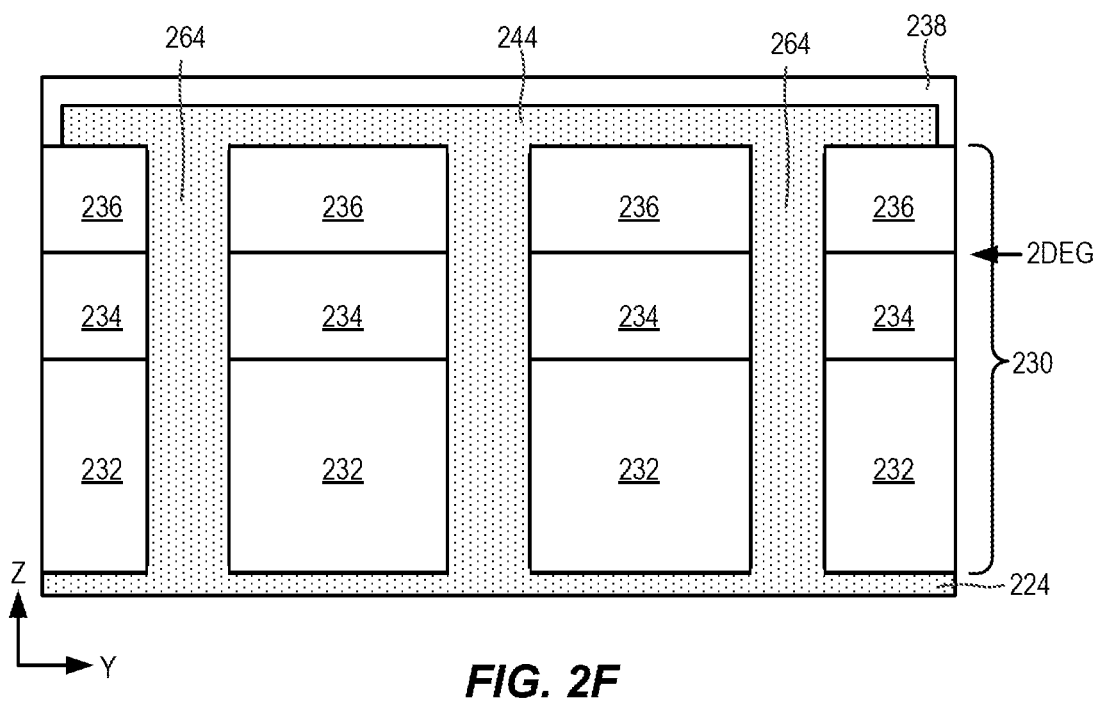
FIG. 2F is a cross-sectional view taken along line 2F-2F of FIG. 2B.
Figure 2G:
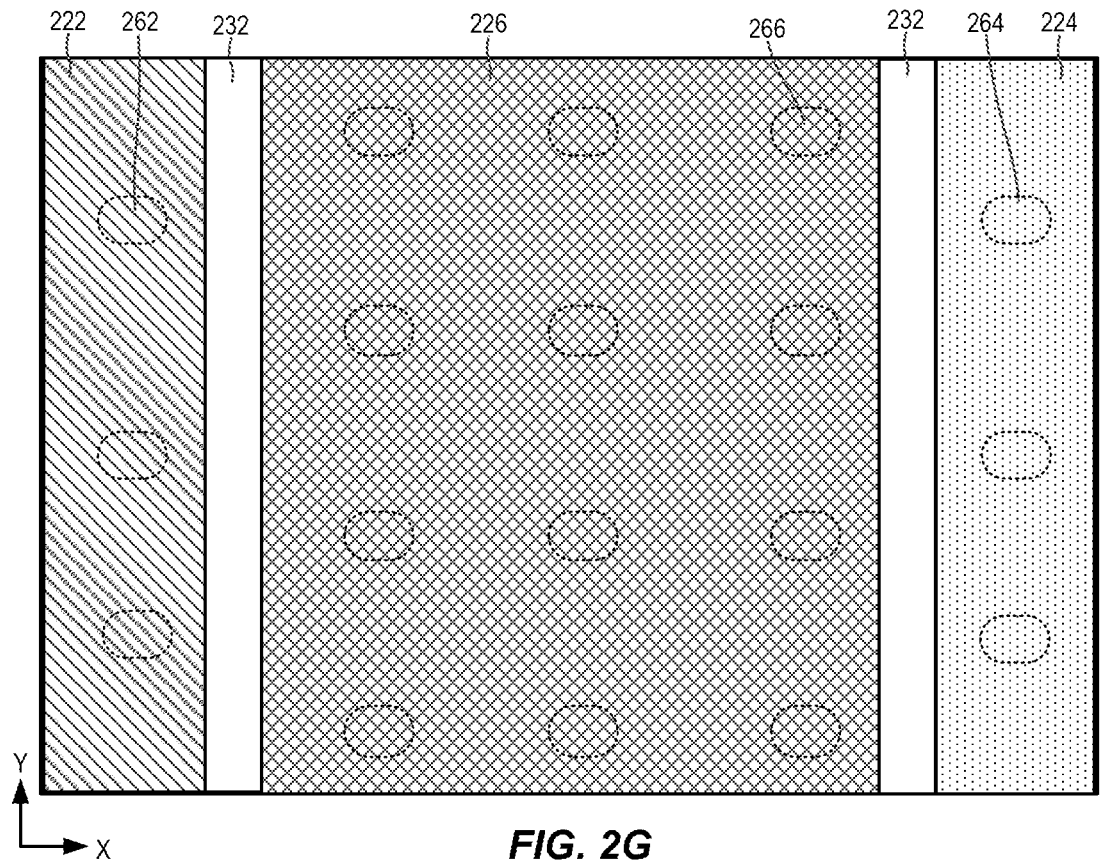
FIG. 2G is a schematic back side view of the RF amplifier die included in the Group III nitride-based RF amplifier of FIG. 2A.
Figure 2H:
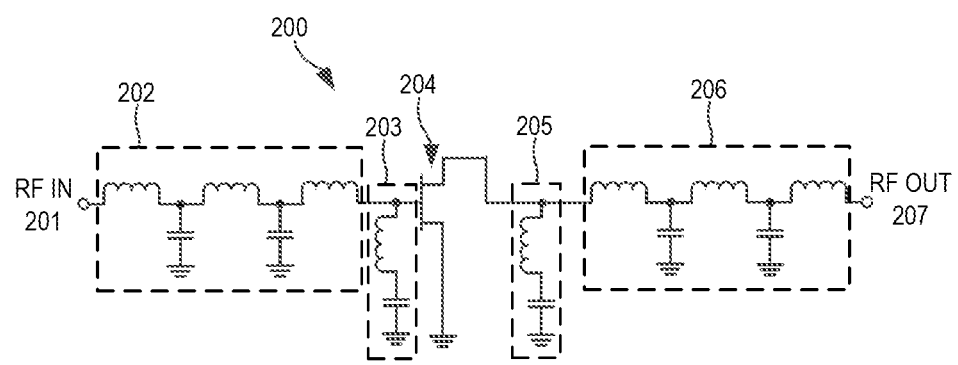
FIG. 2H is a circuit diagram of the Group III nitride-based RF amplifier of FIG. 2A.

Referring to FIGS. 2C and 2D, the semiconductor layer structure 230 includes a plurality of semiconductor layers. In the depicted embodiment, a total of two semiconductor layers are shown, namely a channel layer 234 and a barrier layer 236 that is on a top side of the channel layer 234. The semiconductor layer structure 230 may include additional semiconductor and/or non-semiconductor layers. For example, the semiconductor layer structure 230 may include a growth substrate 232 on which the other semiconductor layers are grown. The growth substrate 232 may comprise, for example, a 4H-SiC or 6H-SiC substrate. In other embodiments, the growth substrate may comprise a different semiconductor material (e.g., silicon or a Group III nitride-based material, GaAs, ZnO, InP) or a non-semiconductor material (e.g., sapphire).

SiC has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

Optional buffer, nucleation and/or transition layers (not shown) may be provided on the growth substrate 232 beneath the channel layer 234. For example, an AlN buffer layer may be included to provide an appropriate crystal structure transition between a SiC growth substrate 232 and the remainder of the semiconductor layer structure 230. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 234 is a Group III nitride material, such as $Al_xGa_{1-x}N$ where $0 \leq x < 1$, provided that the energy of the conduction band edge of the channel layer 234 is less than the energy of the conduction band edge of the barrier layer 236 at the interface between the channel and barrier layers 234, 236. In certain embodiments of the present invention, x=0, indicating that the channel layer 234 is gallium nitride ("GaN"). The channel layer 234 may also be other Group III nitrides such as InGaN, AlInGaN or the like. The channel layer 234 may be undoped or unintentionally doped and may be grown to a thickness of, for example, greater than about 20 Å. The channel layer 234 may also be a multi-layer structure, such as a superlattice or combinations of GaN, AlGaN or the like.

The channel layer 234 may have a bandgap that is less than the bandgap of at least a portion of the barrier layer 236, and the channel layer 234 may also have a larger electron affinity than the barrier layer 236. In certain embodiments, the barrier layer 236 is AlN, AlInN, AlGaN or AlInGaN with a thickness of between about 0.1 nm and about 10 nm or more. In particular embodiments, the barrier layer 236 is thick enough and has a high enough Al composition and doping to induce a significant carrier concentration at the interface between the channel layer 234 and the barrier layer 236.

The barrier layer 236 may be a Group III nitride and may have a bandgap larger than that of the channel layer 234 and a smaller electron affinity than the channel layer 234. In certain embodiments, the barrier layer 236 is undoped or doped with an n-type dopant to a concentration less than about $10^{19}$ cm$^{-3}$. In some embodiments of the present invention, the barrier layer 236 is $Al_xGa_{1-x}N$ where 0<x<1. In particular embodiments, the aluminum concentration is about 25%. However, in other embodiments of the present invention, the barrier layer 236 comprises AlGaN with an aluminum concentration of between about 5% and about 100%. In specific embodiments of the present invention, the aluminum concentration is greater than about 10%.

Due to the difference in bandgap between the barrier layer 236 and the channel layer 234 and piezoelectric effects at the interface between the barrier layer 236 and the channel layer 234, a two-dimensional electron gas (2DEG) is induced in the channel layer 234 at a junction between the channel layer 234 and the barrier layer 236. The 2DEG acts as a highly conductive layer that allows conduction between the source region of each unit cell transistor 216 and its associated drain region, where the source region is the portion of the semiconductor layer structure 230 that is directly underneath the source finger 256 and the drain region is the portion of the semiconductor layer structure 230 that is directly underneath the corresponding drain finger 254.

An interlayer insulating layer 238 is formed over the gate fingers 252, the drain fingers 254, and the source fingers 256. The interlayer insulating layer 238 may include a dielectric material, such as SiN, $SiO_2$, etc.

FIGS. 2C-2G illustrate the metal-plated gate vias 262, metal-plated drain vias 264, and metal-plated source vias 266 in more detail. As shown in FIGS. 2C through 2F, the metal-plated gate vias 262, metal-plated drain vias 264, and metal-plated source vias 266 may extend the entire way through the semiconductor layer structure 230 in order to physically and electrically connect the gate bus 242 to the gate terminal 222, the drain bus 244 to the drain terminal 224, and the source fingers 256 to the source terminal 226.

In some embodiments, the metal-plated gate vias 262, metal-plated drain vias 264, and metal-plated source vias 266 may all have the same shape and horizontal cross-section (i.e., a cross-section taken through the vias in a plane that is parallel to a major surface of the semiconductor layer structure 230). For example, all of the vias 262, 264, 266 may be substantially cylindrical vias having the same diameter, or may all be truncated fustoconical vias that have the same diameter when measured at the same height above the bottom surface 214 of the RF amplifier die 210. Such an arrangement may allow all of the vias 262, 264, 266 to be readily formed in a single manufacturing step. In other embodiments, the metal-plated gate vias 262 and/or the metal-plated drain vias 264 may have a larger cross-sectional area as compared to the metal-plated source vias 266. This technique may be used to further reduce the inherent inductance of the metal-plated gate vias 262 and/or the metal-plated drain vias 264, if necessary, for certain applications.

The metal-plated gate vias 262, metal-plated drain vias 264, and metal-plated source vias 266 may each be implemented by forming openings though the semiconductor layer structure (e.g., by anisotropic etching) and by then depositing metal-plating that coats the sidewalls of the openings. In some applications, the metal may completely fill the openings so that the metal-plated vias are metal-filled vias. However, in many applications, the RF amplifier die 210 may operate over a wide temperature range (due to outdoor applications and/or the high levels of heat that may be generated within the RF amplifier die during device operation), which may lead to high stress levels in the device due to the metal and semiconductor materials having significantly different coefficients of thermal expansion. In such cases, the center of the metal-plated vias 262, 264, 266 may be left open (i.e., air-filled) in order to reduce the amount of stress that occurs due to thermal cycling.

The cross-sectional areas of the vias 262, 264, 266 may be selected, for example, based on heat dissipation considerations and/or a desired amount of series inductance. Whether a metal-plated via will dissipate more or less heat than the semiconductor material that the metal-plated via penetrates will depend upon a variety of considerations, including the thermal dissipation qualities of the semiconductor material and the metal used, the thickness of the metal plating, the cross-sectional area(s) of the vias, etc. Generally speaking, metals such as copper dissipate heat more efficiently than Group III nitride-based and silicon carbide semiconductor materials, but any central air-filled opening in the vias will dissipate heat less efficiently than the semiconductor materials.

As shown in FIG. 2G, the gate terminal 222, the drain terminal 224 and the source terminal 226 may each comprise a metallization pattern on a lower surface 232 of the semiconductor layer structure 230. Gaps may be provided between the gate terminal 222 and the drain terminal 224 and between the drain terminal 224 and the source terminal 226 in order to electrically insulate the gate, drain and source terminals 222, 224, 226 from each other. In some embodiments, an insulating pattern (not shown) may be deposited in the gaps. As shown in FIG. 2G, the gate vias 262, the drain vias 264 and the source vias 266 each physically and electrically connect to the respective gate terminal 222, drain terminal 224 and source terminal 226. It should also be noted that while the metal-plated gate vias 262, the metal-plated drain vias 264 and the metal-plated source vias 266 are illustrated as having oval horizontal cross-sections in the embodiment of FIGS. 2A-2G, metal-plated vias having oval horizontal cross-sections are just an example. It will be appreciated that metal-plated vias having any arbitrary horizontal cross-section may be used including, for example, round, square, rectangular, etc. It will also be appreciated that the shape and/or size of the horizontal cross-section of any particular metal-plated via need not be constant. For example, some or all of the metal-plated vias can be tapered vias that have an area that changes as a function of depth. It will also be appreciated that the size and/or density of the metal-plated gate vias 262, the metal-plated drain vias 264 and the metal-plated source vias 266 may likewise be varied. For example, the size and/or density of the metal-plated drain vias 264 may be selected based on the current handling capabilities of the device.

FIG. 2H is a circuit diagram of the Group III nitride-based RF amplifier 200. As shown in FIG. 2H, the Group III nitride-based RF amplifier 200 includes an RF input 201, an input impedance matching network 202, an input harmonic termination circuit 203, an RF amplifier 204, an output harmonic termination circuit 205, an output impedance matching network 206, and an RF output 207. The input impedance matching network 202 is coupled between the RF input 201 and the gate terminal of the RF amplifier 204. The input harmonic termination circuit 203 is coupled between the gate terminal of the RF amplifier 204 and ground, and is implemented as a series L-C circuit. The output harmonic termination circuit 205 is coupled between the drain terminal of the RF amplifier 204 and ground, and is also implemented as a series L-C circuit. Both the harmonic termination circuits 203, 205 may be configured to suppress second order or third order harmonics in example embodiments. The output impedance matching network 206 is coupled between the drain terminal of the RF amplifier 204 and the RF output 207. In the depicted embodiment, both impedance matching networks 202, 206 have high-pass inductor-capacitor ("L-C") configurations, but it will be appreciated that either or both impedance matching networks 202, 206 may have other topologies (e.g., a low-pass L-C topology) in other embodiments.

While FIG. 2H illustrates one example embodiment of the matching networks, it will be appreciated that many modifications may be made thereto. For example, one or both of the impedance matching networks 202, 206 may be omitted in other embodiments, as may one or both of the harmonic termination circuits 203, 205. Likewise, additional harmonic termination circuits may be provided (e.g., separate harmonic termination circuits at the input and/or the output of the RF amplifier 204 for second and third order harmonics. The various circuits may have different configurations from what is shown. Additionally, the impedance matching and harmonic termination circuits at the input (or the output) can be combined into a single, multi-purpose circuit.

In the particular implementation shown in FIG. 2H, the matching circuits include a total of four inductances that are coupled to either an input (i.e., the gate terminal) or an output (i.e., the drain terminal) of the RF amplifier 204. The inherent inductance of the gate vias 262 in RF amplifier 200 may comprise a portion of the input-side inductances. The remainder of the input-side inductances may be implemented using discrete circuits or distributed inductances that are implemented on or in the interconnection structure 270. Similarly, the inherent inductance of the drain vias 264 in RF amplifier 200 may comprise a portion of the output-side inductances. The remainder of the output-side inductances may be implemented using discrete circuits or distributed inductances that are implemented on or in the interconnection structure 270.

As discussed above, Group III nitride-based RF amplifiers often include matching networks, such as input impedance matching circuits, output impedance matching circuits, input harmonic termination circuits and output harmonic termination circuits. In some cases, the Group III nitride-based RF amplifier may be implemented as a MMIC device where the matching circuits may be formed on the same die as the RF amplifier circuit. Implementing the Group III nitride-based RF amplifier as a MMIC, however, increases both the size of the die and fabrication costs, and also reduces flexibility since the matching circuits are typically tuned precisely for the planned operating frequency band of the MMIC, and hence separate MMIC devices must be manufactured for each operating frequency band and output power level of interest. In other cases, the RF amplifier may be implemented on a stand-alone die, and the matching circuits may be implemented on one or more separate substrates. In one such embodiment, the RF amplifier die is mounted on an interconnection structure, and the matching networks are implemented using additional die (e.g., capacitor die, inductor die) that are mounted and/or are implemented on and/or within the interconnection structure. The interconnection structure may be implemented, for example, as a printed circuit board, a metal core printed circuit board, an RDL laminate structure or as a substrate having conductive vias and or traces.

When the RF amplifier die is mounted on an interconnection structure that includes matching networks, the conventional approach is to mount the RF amplifier die on the top surface of the interconnection structure with the source terminal provided on the bottom of the RF amplifier die and the gate and drain terminals formed on the top of the RF amplifier die, as discussed above with reference to FIG. 1A. This configuration allows heat that is generated in the RF amplifier die during device operation to be removed from the device through the source vias in the RF amplifier die and through heat dissipation structures in the interconnection structure such as conductive vias. The gate and drain terminals on the top side of the RF amplifier die are electrically connected to the matching circuitry on the interconnection structure through bond wires. These bond wires also provide a portion of the inductance of the matching networks.

As applications move to higher frequencies, the amount of inductance needed to properly impedance match at the fundamental frequency and/or to terminate certain harmonics such as the second and/or third order harmonics typically decreases. In some applications, even if very short, thick bond wires are used, the inductance of the bond wires may exceed the optimum amount of series inductance required by one or more of the matching circuits. If the inductance is larger than the optimum amount of series inductance for an impedance matching circuit then the return loss of the RF amplifier may be increased, and the operating bandwidth may be reduced. If the inductance is larger than the optimum amount of series inductance for a harmonic termination circuit, then less reduction in the harmonic at issue may be achieved, which may degrade the efficiency, power and/or gain performance of the RF amplifier, and result in increased levels of passive intermodulation distortion that may degrade other aspects of a communication system in which the RF amplifier is used. While these problems may be avoided by switching to a MMIC implementation, a discussed above, MMIC RF amplifier designs have their own potential drawbacks.

The Group III nitride-based RF amplifier 200 according to embodiments of the present invention may avoid the above-discussed problem of having too much series inductance, as the gate and drain bond wires that are present in the conventional RF amplifier are replaced by gate and drain vias that extend through the RF amplifier die 210. Typically, the bond wires are at least 20 mils in length, with bond wire lengths of 30 miles or more being common. In contrast, the gate and drain vias may be much shorter, and are typically less than 8 mils in length, and can be less than 5 mils, less than 4 mils or even less than 3 mils in length in example embodiments. As such, the series inductance injected by the gate and drain vias may be a small fraction of the series inductance injected by comparable gate and drain bond wires (e.g., perhaps on the order of 15-20% the inductance injected by conventional gate and drain bond wires), which may ensure that the series inductance is less than the optimum amount of series inductance required by the various matching circuits of the Group III nitride-based RF amplifier. The additional series inductance required to obtain the optimum amount of series inductance for the matching networks may be added using inductor chips and/or inductive traces (or other structures) that are mounted on or implemented in the interconnection structure.

Mounting the gate and drain terminals on the bottom side of the device may also reduce process variation during high volume manufacturing, as the ball bonders that are used to solder the bond wires to the gate and drain terminals on RF amplifier die and to gate and drain pads on an interconnection structure typically have a tolerance of +/−1 mil, resulting in potentially as much as 4 mils of variation in the length of each bond wire. The amount of inductance associated with such variation in the lengths of the bond wires can be significant, particularly at higher frequencies, and can degrade the performance of the impedance matching circuits, and hence the performance of the RF amplifier. Additionally, connecting the gate and drain terminals to corresponding gate and drain pads on the interconnection structure through a surface mount process using conductive epoxy or solder may allow for the use of smaller gate and drain terminals than could be used when bond wire connections are required, and hence the RF amplifier die according to embodiments of the present invention may be smaller in applications where the gate and drain terminal sizes determined the size of the die. Additionally, using ball bonding techniques as opposed to wire bonds may reduce manufacturing costs.

Thus, the RF amplifiers according to embodiments of the present invention may exhibit improved product assembly consistency, higher yields, increased product integration, reduced cost and improved RF performance. The benefits may be enhanced with respect to higher frequency applications as the inductance required in the matching circuits may be much lower in such applications, and hence the use of traditional bond wires may inject too much inductance. Additionally, the tolerances in the bond wire lengths may have a larger impact at higher frequencies, and in high frequency applications (particularly if lower power) the size of the bond pads may drive the size of the die. In some embodiments, any of the RF amplifiers disclosed herein may be configured to operate at frequencies greater than 1 GHz. In other embodiments, these RF amplifiers may be configured to operate at frequencies greater than 2.5 GHz. In still other embodiments, these RF amplifiers may be configured to operate at frequencies greater than 3.1 GHz. In yet additional embodiments, these RF transistor amplifier dies may be configured to operate at frequencies greater than 5 GHz. In some embodiments, these RF amplifiers may be configured to operate in at least one of the 2.5-2.7 GHz, 3.4-4.2 GHz or 5.1-5.8 GHz frequency bands or sub-portions thereof As discussed in further detail herein, the RF amplifiers according to embodiments of the invention may be mounted within a package that protects the RF amplifier die and provides input and output leads that connect the RF amplifier to external signal and power sources. In an example embodiment, the packaging may be a plastic overmold package that covers some, but not all of the interconnection structure. In such embodiments, the input and output leads may be implemented, for example, as conductive traces on the interconnection structure. It will be appreciated, however, that any suitable packaging may be used including ceramic packages, other plastic packages and the like.

Figure 3:
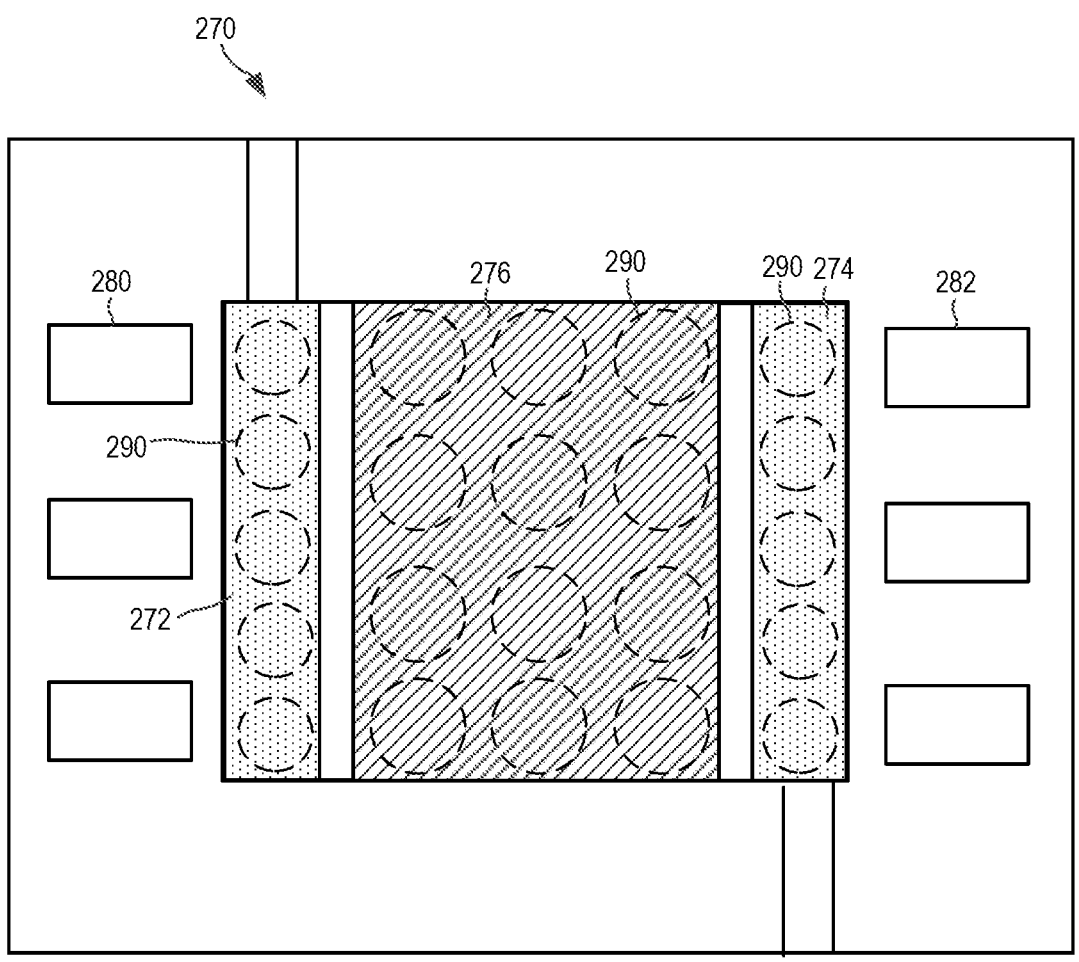
FIG. 3 is a plan view of an embodiment of an interconnection structure that may be used in the RF amplifier of FIGS. 2A-2H.

FIG. 3 is a schematic top view of an example embodiment of the interconnection structure 270 included in the RF amplifier 200 of FIGS. 2A-2H. As shown in FIG. 3, the interconnection structure 270 may comprise a printed circuit board, such as a multilayer printed circuit board or an RDL laminate structure. The gate pad 272, drain pad 274 and source pad 276 are implemented on an upper surface of the interconnection structure 270. Each of these pads may comprise a respective metal pattern (e.g., a copper pattern). The gate pad 272, drain pad 274 and source pad 276 may have the same or similar sizes and shapes as the respective gate terminal 222, drain terminal 224 and source terminal 226 on the RF amplifier die 210. A plurality of metal filled vias 290 may be provided underneath the source pad 276 that extend through the interconnection structure 270. The metal-filled vias 290 may act as a heat sink that carries heat that is generated in the RF amplifier die 210 and passed to the interconnection structure 270 through the semiconductor layer structure 230 and the source vias 260 to the bottom side of the interconnection structure 270 where it is vented into the ambient environment. As is also shown in FIG. 3, in some embodiments, additional metal-filled vias 290 may be provided under the gate pad 272 and/or under the source pad 276.

As is further shown in FIG. 3, a plurality of additional integrated circuit chips 280 or other chips 282 may be mounted on the interconnection structure 270. These chips 280, 282 may include, for example, chips that include capacitors and/or inductors that are part of the input and/or output matching circuits, chips that include biasing circuits that are used to bias the RF amplifier die 210, other RF circuitry such as transmit/receive switches, circulators, filters or the like. The interconnection structure 270 may also include meandered or spiral trace patterns (not shown) that implement inductors that are included in the input and/or output matching circuits. Numerous other circuit elements may be mounted on or implemented in the interconnection structure 270.

Figure 4:
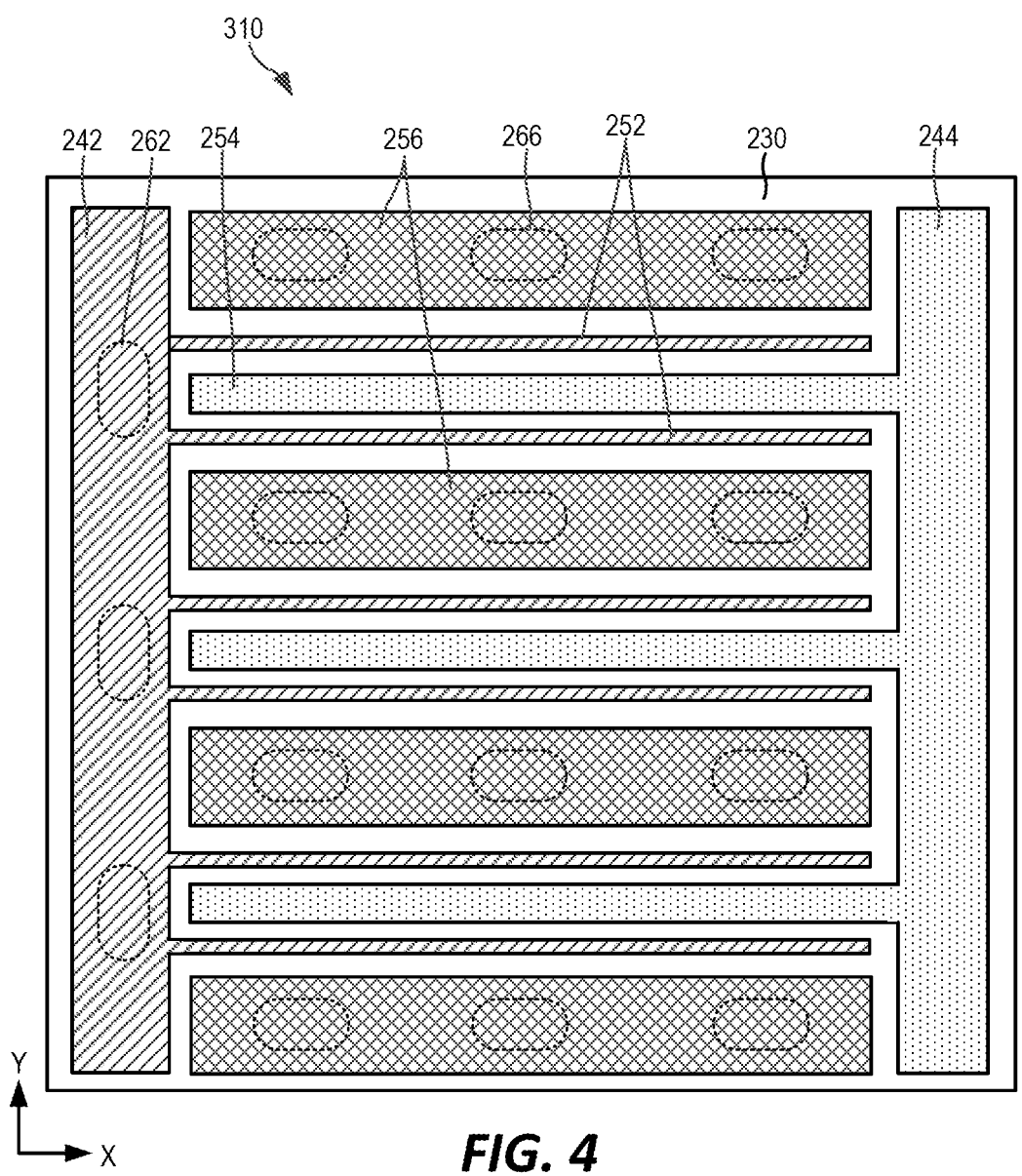
FIG. 4 is a schematic view that shows the structure of the top metallization of an RF amplifier die according to further embodiments of the present invention.
Figure 5:
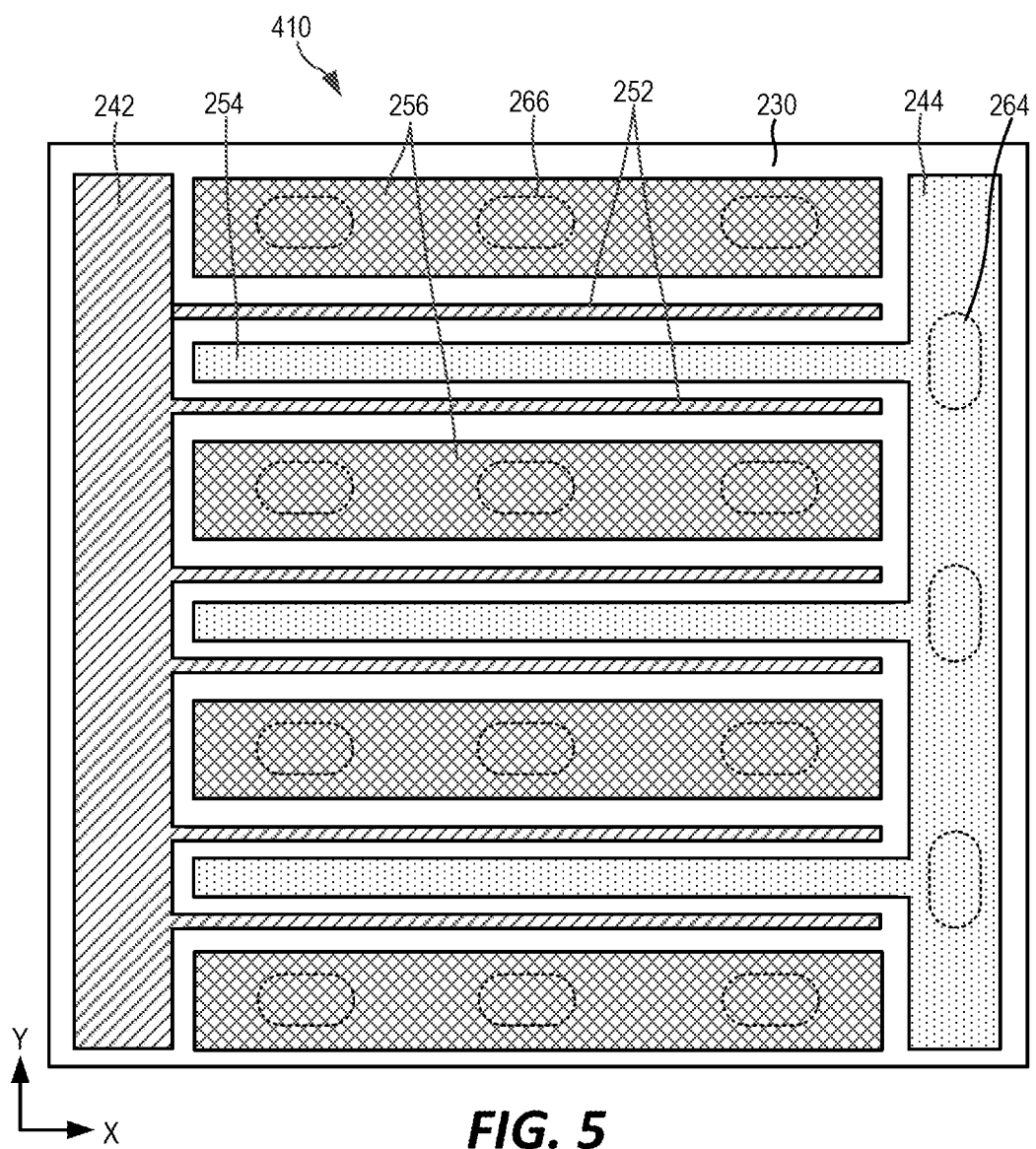
FIG. 5 is a schematic view that shows the structure of the top metallization of an RF amplifier die according to further embodiments of the present invention.

FIGS. 4 and 5 are schematic views that illustrate the structure of the top metallization of two RF amplifier dies according to further embodiments of the present invention.

As shown in FIG. 4, an RF amplifier die 310 according to embodiments of the present invention is very similar to RF amplifier die 210, except that RF amplifier die 310 does not include drain vias 264, and the drain terminal in RF amplifier die 310 may be implemented on the top side of the semiconductor layer structure 230 and connected to a drain pad on the interconnection structure via bond wire(s), in the manner discussed above with reference to the RF amplifier 100 of FIGS. 1A-1B. The RF amplifier die 310 may be used, for example, when bond wires do not provide too much inductance for any of the output matching networks. The remainder of RF amplifier die 310 may be identical to RF amplifier 210, and hence further description thereof will be omitted.

As shown in FIG. 5, an RF amplifier die 410 according to embodiments of the present invention is also very similar to RF amplifier die 210, except that RF amplifier die 410 does not include gate vias 262, and the gate terminal in RF amplifier die 410 may be implemented on the top side of the semiconductor layer structure 230 and connected to a gate pad on the interconnection structure via bond wire(s), in the manner discussed above with reference to the RF amplifier 100 of FIGS. 1A-1B. The RF amplifier die 410 may be used, for example, when bond wires do not provide too much inductance for any of the input matching networks. The remainder of RF amplifier die 410 may be identical to RF amplifier 210, and hence further description thereof will be omitted.

Figure 6A:
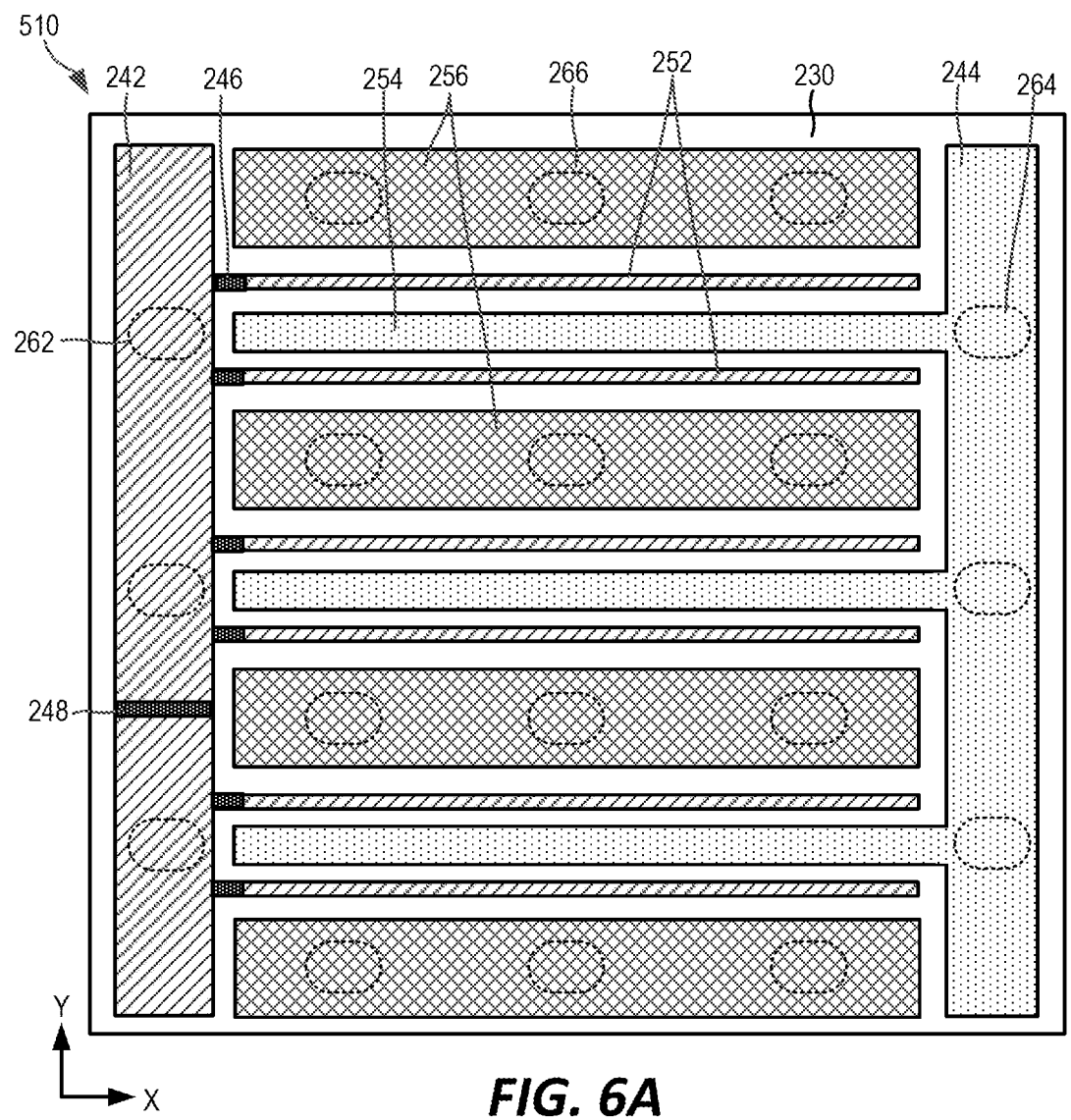
FIGS. 6A and 6B are schematic top side and back side views, respectively, of an RF amplifier die according to further embodiments of the present invention.
Figure 6B:
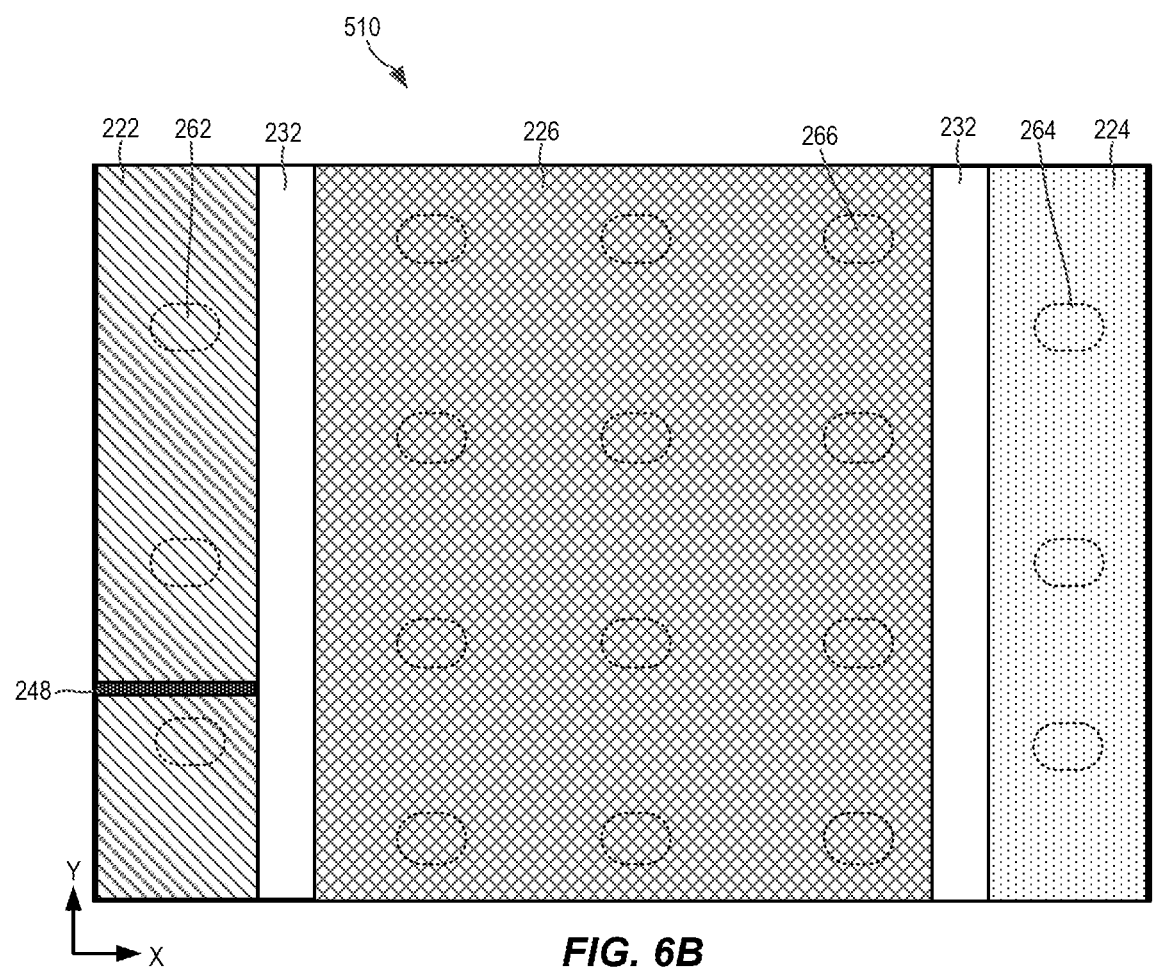

It will also be appreciated that the RF amplifiers according to embodiments of the present invention can have any appropriate design and may include additional circuit elements. For example, the RF amplifiers may include odd-mode and/or gate resistors as is discussed, for example, in U.S. Pat. No. 10,128,365, the entire content of which is incorporated herein by reference. FIGS. 6A and 6B are schematic top side and back side views of an RF amplifier die 510 according to further embodiments of the present invention. The RF amplifier die 510 may be identical to the RF amplifier die 210 discussed above except that the RF amplifier die 510 further includes series gate resistors 246 and odd mode resistors 248.

As shown in FIG. 6A, series gate resistors 246 are included in the RF amplifier die 510. In the depicted embodiment, a series gate resistor 246 is provided at the location where each gate finger 252 connects to the gate bus 242. As shown in FIGS. 6A and 6B, the gate bus 242 and/or the gate terminal 222 may also be segmented into multiple sections, and odd mode resistors 248 may be disposed between the sections. In high power devices, the gates may have long gate widths (i.e., extend further in the x-direction) in order to increase the gate periphery of the device, which results in long feedback loops. Because these high-power devices may have large transconductance values, the feedback loops may be prone to instability. For example, the feedback loops may generate an unwanted signal which may be in or out of the frequency band of operation of the device. The generation of such signals may be problematic, and may render the device unusable. The instability of the feedback loops tends to increase with the length of the feedback loop. The series gate resistors 246 and the odd mode transistors 248 may stabilize these feedback loops within the gate fingers 252 and drain fingers 254 of the device. It will be appreciated that series gate resistors 246 and/or odd mode transistors 248 may be included in any of the RF transistor amplifiers according to embodiments of the present invention that are disclosed herein.

Figure 7A:
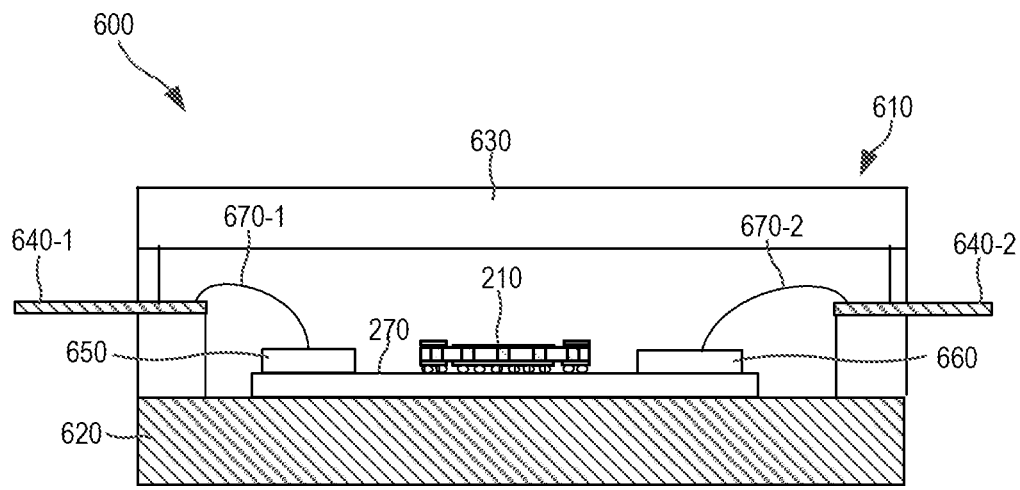
FIG. 7A is a schematic cross-sectional view of a packaged RF transistor amplifier that includes the RF transistor amplifier die of FIG. 2B in a ceramic package.

FIG. 7A is a schematic cross-sectional view of a packaged RF transistor amplifier 600 that includes the RF transistor amplifier die 210 of FIG. 2B in an open cavity package. As shown in FIG. 7A, the open cavity package 610 includes a base 620, such as a metal flange, and an upper housing 630 which may include, for example, sidewalls and a lid, such as a ceramic lid. The RF transistor amplifier die 210 may, for example, be mounted on an interconnection structure 270 using contacts such as, for example, solder pads, conductive adhesives, conductive bumps or the like. The interconnection structure 270 may be mounted on the base 620 using, for example, a conductive die attach material. The base 620 may comprise, for example, a metal base that may dissipate heat carried through heat dissipation structures in interconnection structure 270 outside of ceramic package 610.

Additional components 650, 660 may be mounted on the interconnection structure 270. These additional components may include, for example, one or more input matching components 650 and/or one or more output matching components 660 that are used to impedance match at the fundamental frequency and/or to terminate intermodulation products to ground. These matching components 650, 660 may be passive RF components that include resistors, capacitors and/or inductors that are implemented (at least partially) in integrated passive devices or printed circuit boards, for example. Conductive leads 640 extend through the housing 610 to allow the RF transistor amplifier 600 to be connected to external devices/circuits/power sources. In the depicted embodiment, wire bonds 670 are used to connect the conductive leads 640 to passive RF components 650, 660 on the interconnection structure 270. An RF signal input to the RF transistor amplifier 600 on a first lead 640-1 may be passed through the wire bond 670-1 to input matching circuit 650 and from there to a gate terminal 222 of the RF transistor amplifier die 210 via a first conductive trace or path (not shown) on/in interconnection structure 270, and the amplified output RF signal may be passed from the drain terminal 224 of the RF transistor amplifier die 210 to the output matching circuit 660 via a second conductive trace or path (not shown) on/in interconnection structure 270, and from there to the bond wire 670-2 where the RF signal is output through lead 640-2.

Figure 7B:
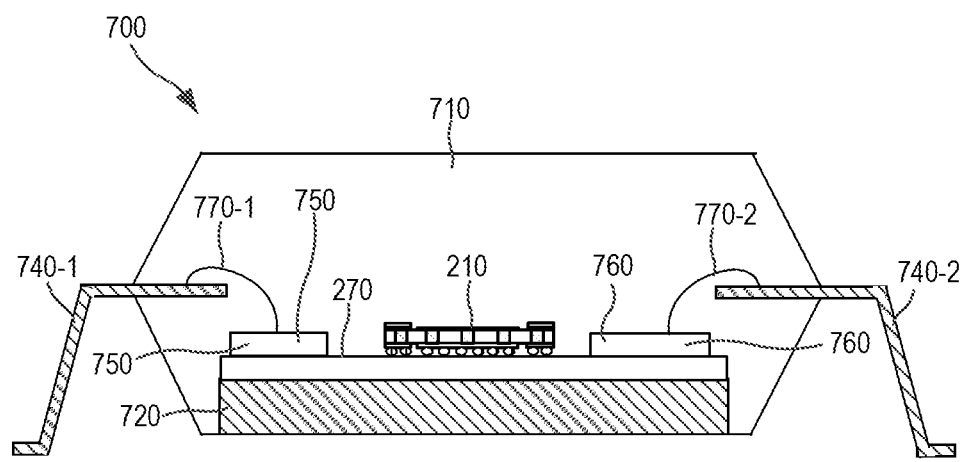
FIG. 7B is a schematic cross-sectional view of a packaged RF transistor amplifier that includes the RF transistor amplifier die of FIG. 2B in an overmold plastic package.

FIG. 7B is a schematic cross-sectional view of a packaged RF transistor amplifier 700 that includes the RF transistor amplifier die 210 of FIG. 2B in an overmold plastic package. As shown in FIG. 7B, the packaged RF transistor amplifier 700 includes a base 720, such as a metal heat sink that is part of a lead frame or metal slug, that is at least partially surrounded by a plastic overmold 710. The RF transistor amplifier die 210 is mounted on an interconnection structure 270, and the interconnection structure 270 is mounted on the base 720. The base 720 may comprise, for example, a metal base that may dissipate heat carried through heat dissipation structures in interconnection structure 270. Additional components 750, 760 are mounted on the interconnection structure 270. These additional components may include, for example, input matching components 750 and output matching components 760 that are used to impedance match at the fundamental frequency and/or to terminate intermodulation products to ground. Conductive leads 740 extend through the plastic overmold 710 to allow the RF transistor amplifier 700 to be connected to external devices/circuits/power sources. In the depicted embodiment, wire bonds 770 are used to connect the conductive leads 740 to the passive RF components 750, 760 on the interconnection structure 270, although the wire bonds 770 may be omitted in other embodiments. Note that herein the term "overmold" is used broadly to encompass protective plastic coatings and the like that are deposited on top of a wafer before the wafer is diced into individual die.

It will be appreciated that any of the RF transistor amplifiers according to embodiments of the present invention that are discussed herein may be mounted in packages such as the open cavity and overmold packages shown in FIGS. 7A and 7B, respectively. Thus, the RF transistor die 210 and interconnection structures 270 shown in FIGS. 7A-7B may be replaced with the RF transistor die and interconnection structures according to any of the embodiments of the present invention that are discussed herein to provide many further embodiments of packaged RF transistor amplifiers. Depending on the embodiment, the packaged RF transistor amplifier can include a monolithic microwave integrated circuit (MMIC) as the RF transistor amplifier die where the RF transistor amplifier die incorporates multiple discrete circuits in a single integrated die. Additionally and/or alternatively, the package can comprise multiple RF transistor amplifier die in a path that are connected in series to form a multiple stage RF transistor amplifier and/or multiple RF transistor amplifier die that are disposed in multiple paths (e.g., in parallel) to form an RF transistor amplifier with multiple transistor amplifier die and multiple paths, such as in a Doherty amplifier configuration. In some embodiments, the packaged RF transistor amplifier may include RF transistor amplifier die according to embodiments of the present invention that have conducive gate and/or conductive drain vias that provide electrical connections to a back side interconnection structure as well as traditional RF transistor amplifier die such as the RF transistor die 110 of FIG. 1A that have gate and drain terminals that are connected to other structures via wire bonds.

Figure 8A:
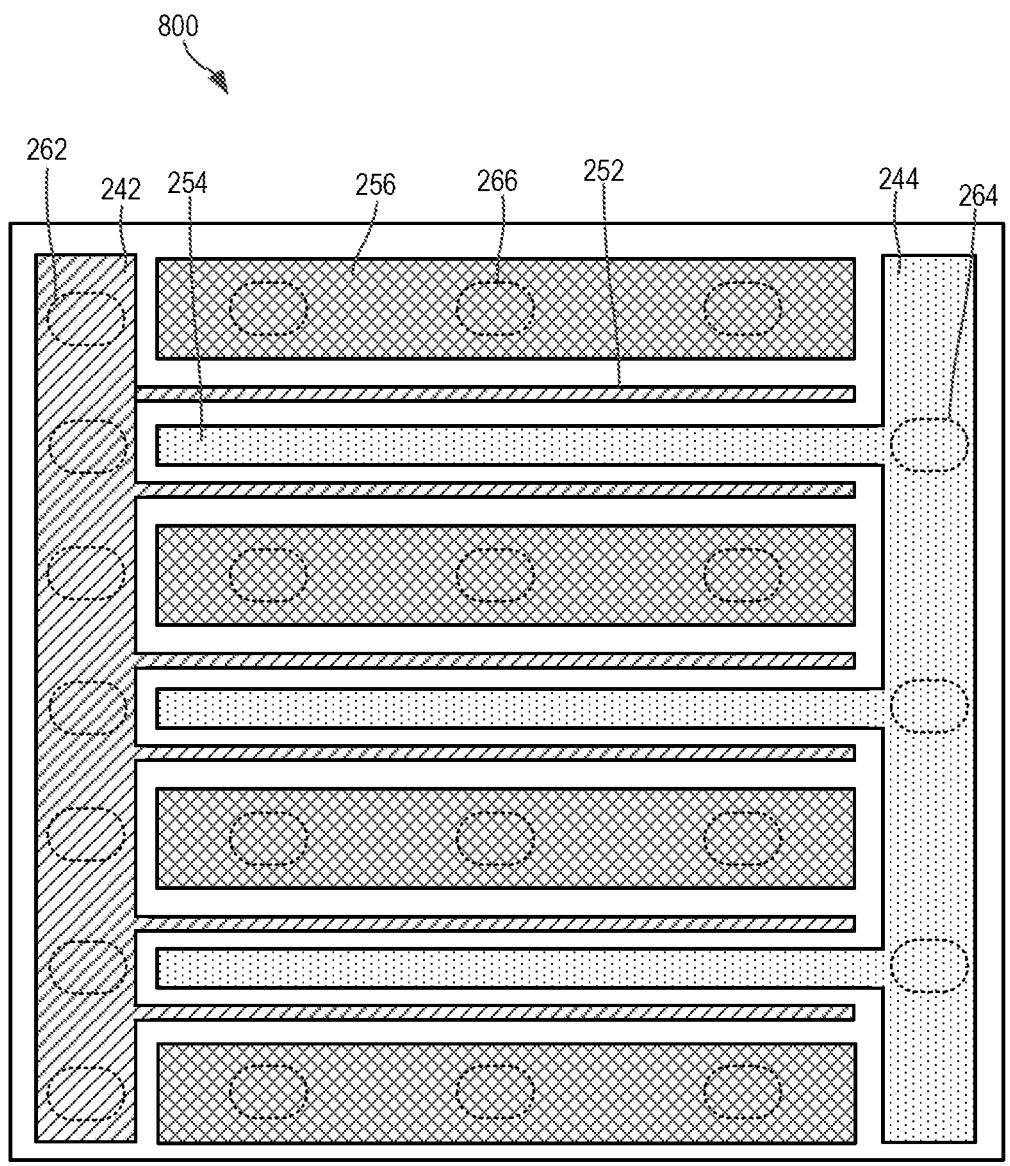
FIGS. 8A-8E are schematic cross-sectional views of packaged RF transistor amplifiers according to still further embodiments of the present invention.
Figure 8B:
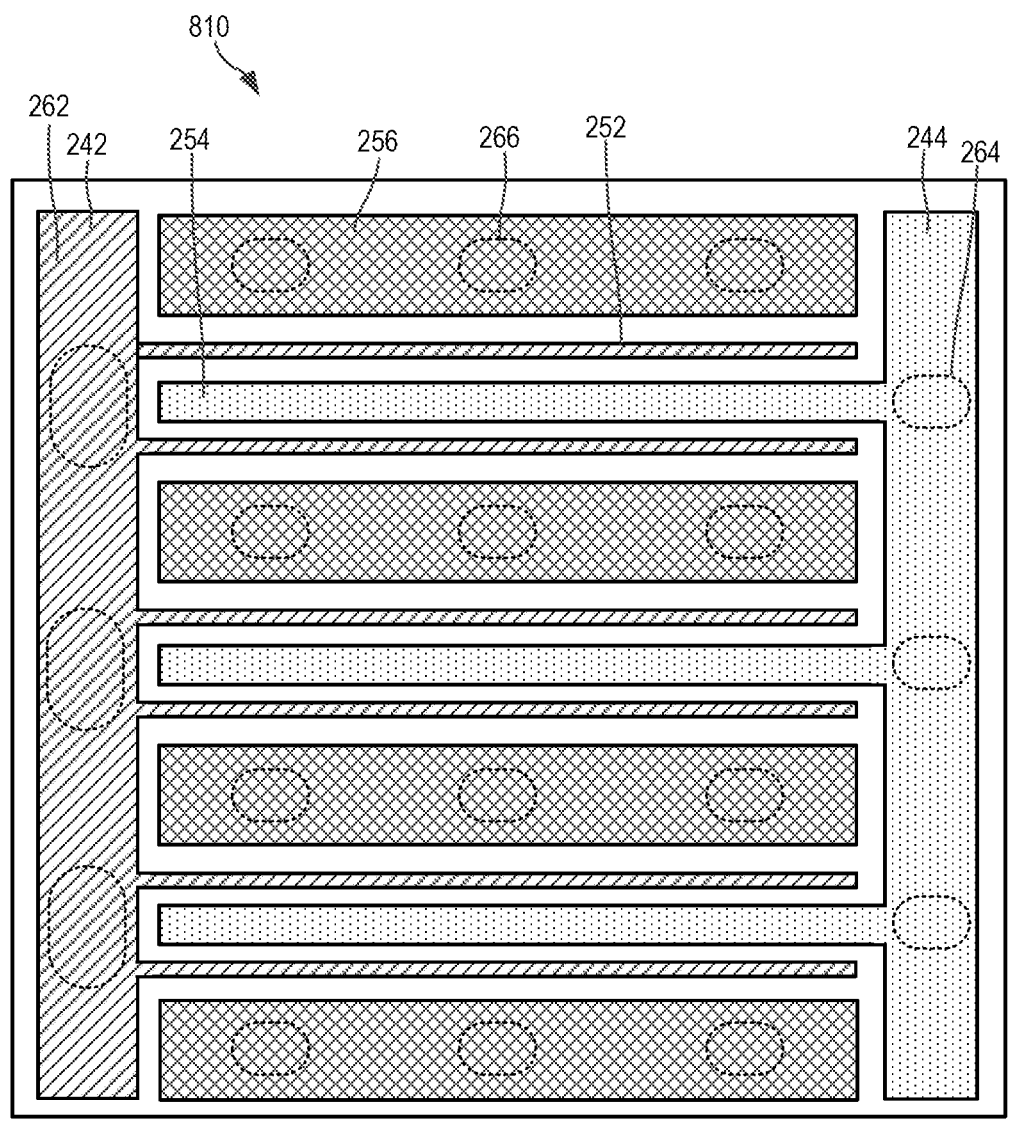
Figure 8C:
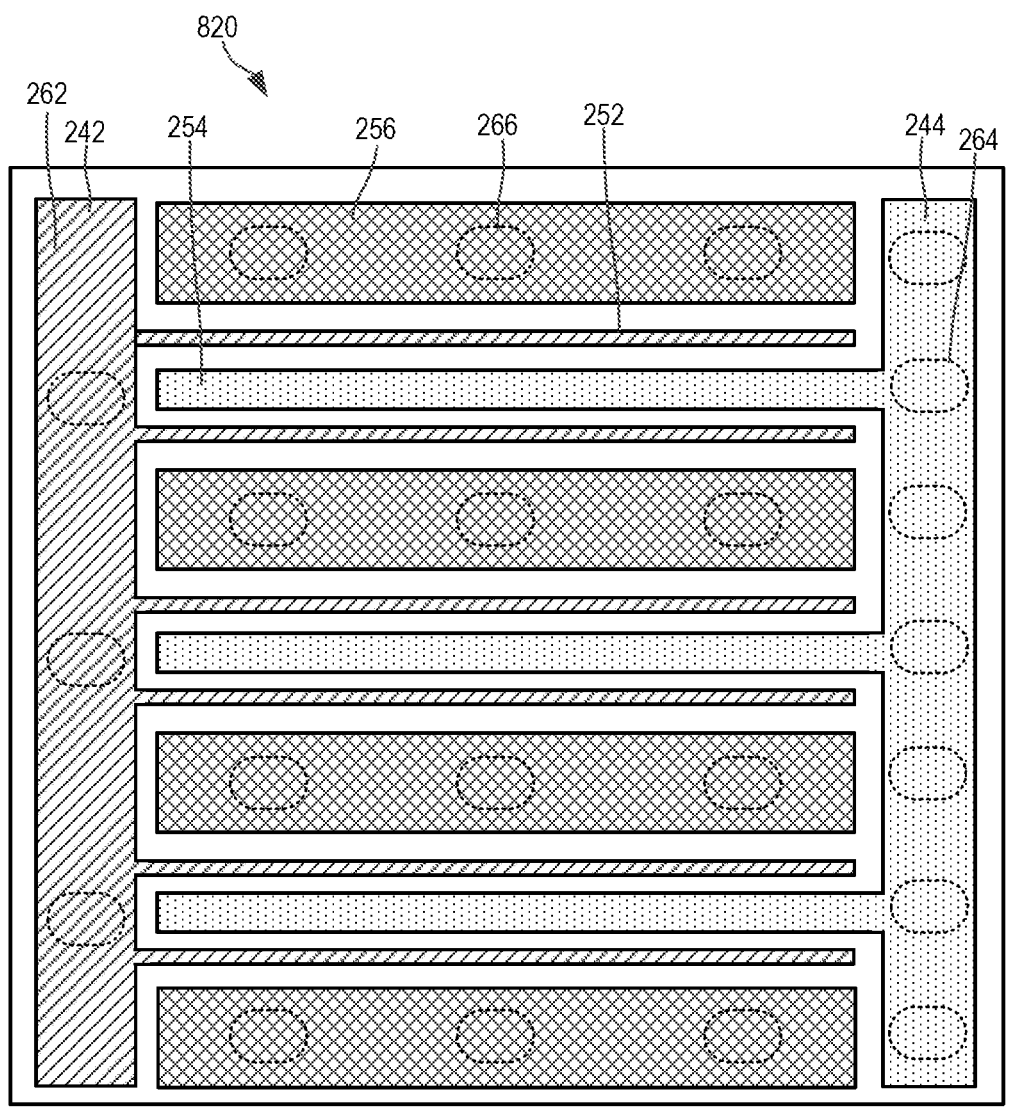
Figure 8D:
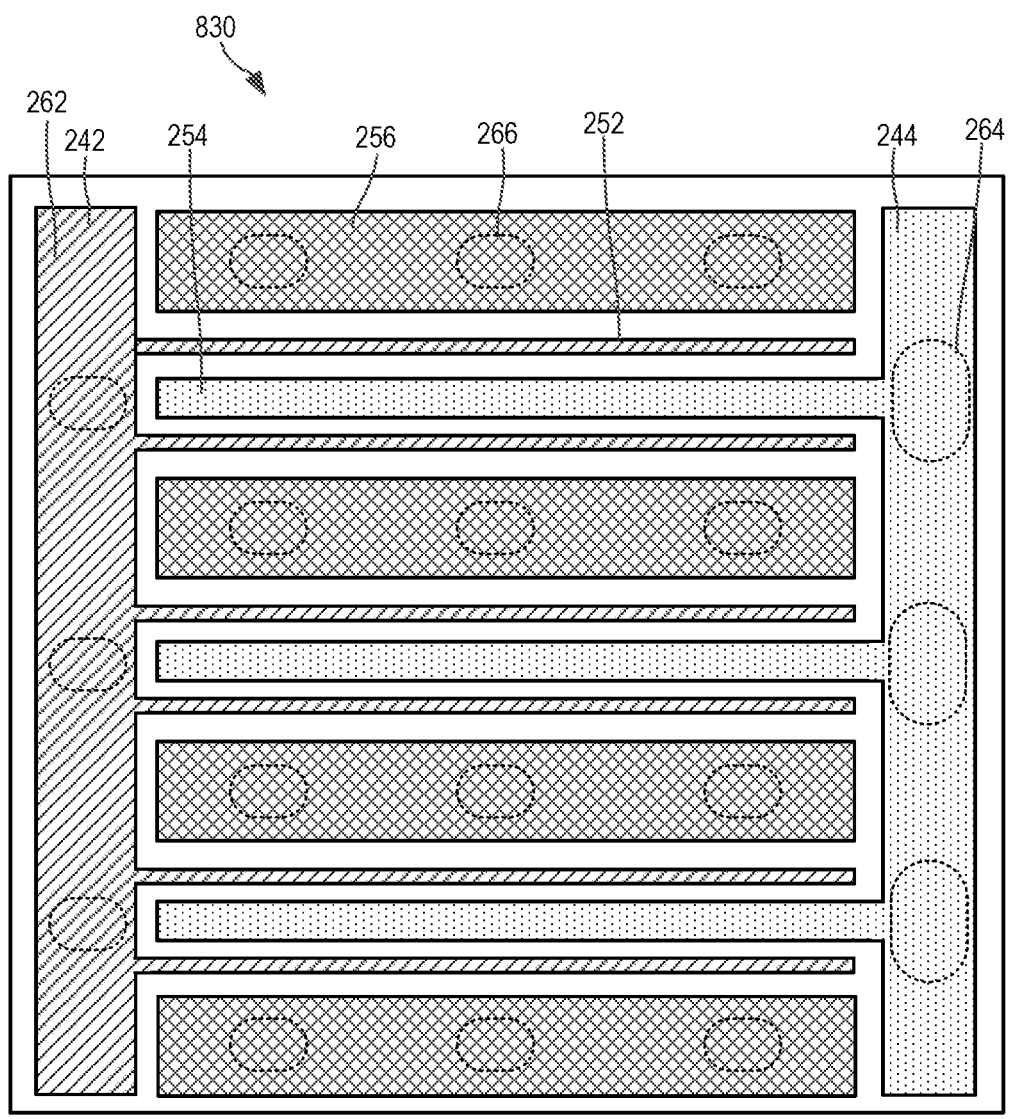
Figure 8E:
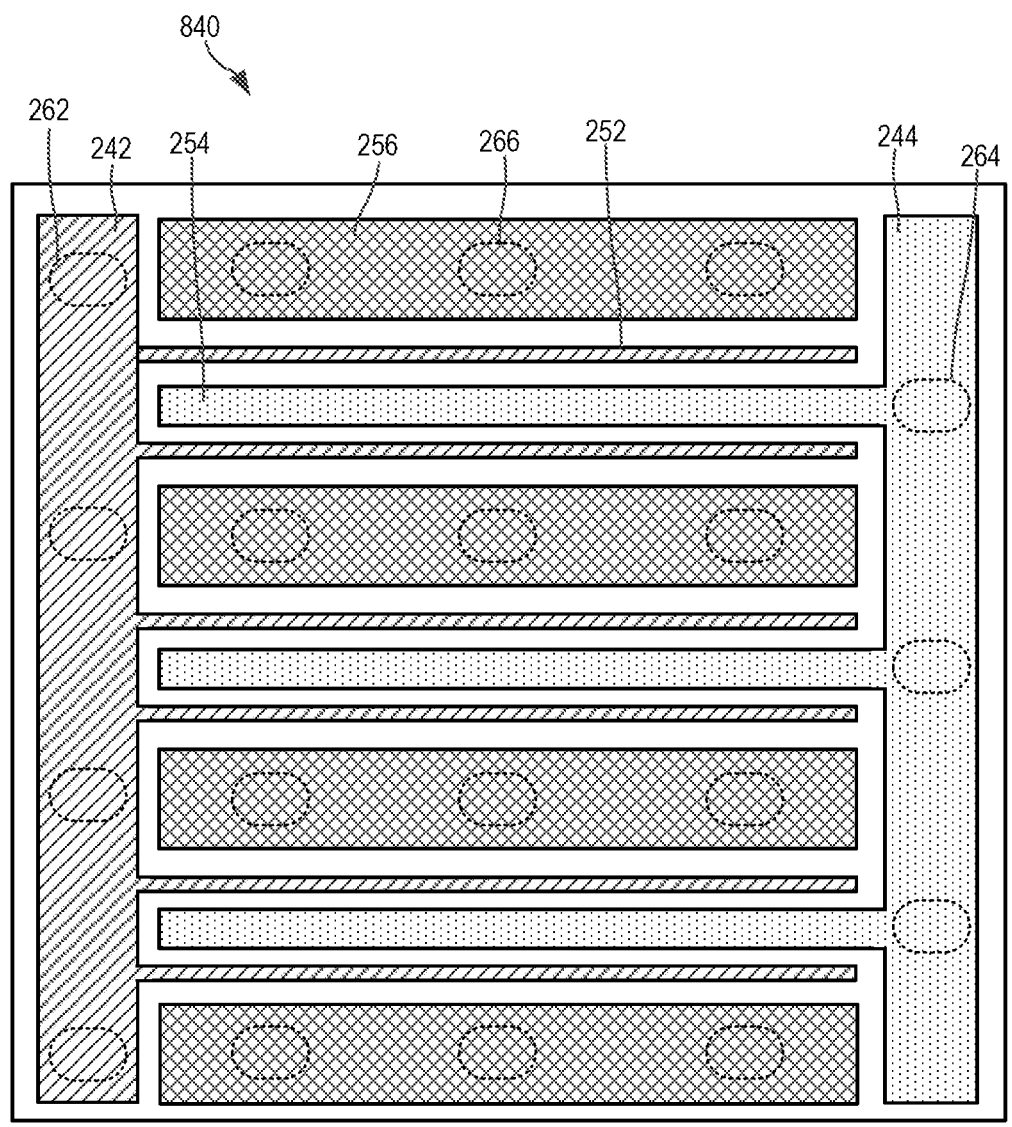

The number, spacing, density and/or cross-sectional area of the conductive vias 262, 264, 266 may be varied as appropriate. As discussed above, the size, shape and/or number of conductive vias can affect various performance parameters of the RF amplifier such as heat dissipation performance and matching performance. The shape, size, location and/or density of the different types of conductive vias may therefore be selected to optimize various performance parameters. For example, FIG. 8A is a schematic cross-sectional view (taken along the equivalent of line 2B-2B of FIG. 2A) of an RF amplifier die 800 which includes many more gate vias 262 than drain vias 264. Such a design may be desirable when the input matching circuits require very low levels of inductance, since the increased number of gate vias 262 may reduce the overall amount of inductance. Similarly, FIG. 8B is a similar schematic cross-sectional view of an RF amplifier die 810, in which the number of gate vias and drain vias is the same, but the size of the gate vias are increased to reduce the inductance. FIGS. 8C and 8D are schematic cross-sectional views of RF amplifier die 820 and 830 that make the same changes to the drain vias 264 rather than to the gate vias 262. It will also be appreciated that the location of the vias 262, 264 may be varied, as shown in FIG. 8E which is a schematic cross-sectional view of yet another RF amplifier die 840.

While the example embodiments discussed above include a single RF amplifier die having a single stage amplifier, it will be appreciated that embodiments of the present invention are not limited thereto. In other embodiments, the amplifiers may include multiple stages, may have a Doherty configuration, etc.

Embodiments of the present inventive concepts have been described above with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A radio frequency ("RF") amplifier, comprising:
   a Group III nitride-based RF amplifier die that includes a semiconductor layer structure and a gate terminal, a source terminal and a drain terminal on the semiconductor layer structure,
   wherein a plurality of unit cell transistors are provided in an upper portion of the semiconductor layer structure, and at least two of the gate terminal, the drain terminal and the source terminal are provided on a lower surface of the semiconductor layer structure,
   wherein at least one of the gate terminal and the drain terminal is electrically connected to the unit cell transistors through a conductive via, and
   wherein an inductance of the conductive via comprises at least a portion of a matching circuit.

2. The RF amplifier of claim 1, wherein the semiconductor layer structure comprises a growth substrate, a channel layer and a barrier layer, where the channel layer is between the growth substrate and the barrier layer.

3. The RF amplifier of claim 2, wherein the Group III nitride-based RF amplifier die further includes a metallization structure that comprises a plurality of gate fingers, a plurality of drain fingers and a plurality of source fingers that are on barrier layer opposite the channel layer, and
   wherein the gate fingers are electrically connected to the gate terminal via the one or more conductive gate vias, and the drain fingers are electrically connected to the drain terminal via the one or more conductive drain vias.

4. The RF amplifier of claim 3, wherein the one or more conductive gate vias and the one or more conductive drain vias extend through the growth substrate.

5. The RF amplifier of claim 1, further comprising an interconnection structure that includes a gate pad that is electrically connected to the gate terminal, a drain pad that is electrically connected to the drain terminal and a source pad that is electrically connected to the source terminal.

6. The RF amplifier of claim 5, wherein the gate pad, the drain pad and the source pad are electrically connected to the gate terminal, the drain terminal and the source terminal, respectively, via a conductive epoxy pattern.

7. The RF amplifier of claim 5, wherein the gate terminal overlaps the gate pad along a first axis that is perpendicular to an upper surface of the interconnection structure, the drain terminal overlaps the drain pad along a second axis that is perpendicular to an upper surface of the interconnection structure, and the source terminal overlaps the source pad along a third axis that is perpendicular to an upper surface of the interconnection structure.

8. The RF amplifier of claim 1, wherein the one or more conductive gate vias, the one or more conductive drain vias and the one or more conductive source vias all have substantially a same shape and substantially a same cross-sectional area.

9. The RF amplifier of claim 5, wherein the interconnection structure includes at least a first portion of the matching circuit and the conductive via comprises a second portion of the matching circuit.

10. A radio frequency ("RF") amplifier, comprising:
a Group III nitride-based RF amplifier die that includes:
a semiconductor layer structure that includes a channel layer and a barrier layer on the channel layer;
a gate terminal;
a drain terminal;
a source terminal;
a plurality of gate fingers that are electrically connected to the gate terminal via at least one conductive gate via;
a plurality of drain fingers that are electrically connected to the drain terminal via at least one conductive drain via; and
a plurality of source fingers that are electrically connected to the source terminal via at least one conductive source via;
wherein the gate fingers, the drain fingers and the source fingers are all on a first side of the semiconductor layer structure,
wherein the gate terminal, the drain terminal and the source terminal are all on a second side of the semiconductor layer structure that is opposite the first side, and
wherein at least one of a number, a size and a shape of at least one of the conductive gate vias, the conductive drain vias and the conductive source vias is configured to optimize at least one of impedance matching and heat dissipation in the RF amplifier.

11. The RF amplifier of claim 10, wherein the semiconductor layer structure further comprises a growth substrate, and the channel layer is between the growth substrate and the barrier layer.

12. The RF amplifier of claim 11, wherein the at least one conductive gate via and the at least one conductive drain via extend completely through the growth substrate.

13. The RF amplifier of claim 12, wherein the at least one conductive gate via and the at least one conductive drain via each comprise metal-plated vias that extend completely through the semiconductor layer structure.

14. The RF amplifier of claim 10, further comprising an interconnection structure that includes a gate pad that is electrically connected to the gate terminal, a drain pad that is electrically connected to the drain terminal and a source pad that is electrically connected to the source terminal.

15. The RF amplifier of claim 14, wherein the gate terminal overlaps the gate pad along a first axis that is perpendicular to an upper surface of the interconnection structure, the drain terminal overlaps the drain pad along a second axis that is perpendicular to an upper surface of the interconnection structure, and the source terminal overlaps the source pad along a third axis that is perpendicular to an upper surface of the interconnection structure.

16. A Group III nitride-based radio frequency ("RF") amplifier die, comprising:
a semiconductor layer structure that has a top side and a bottom side that is opposite the top side;
a plurality of gate fingers on the top side of the semiconductor layer structure;
a plurality of source fingers on the top side of the semiconductor layer structure;
a plurality of drain fingers on the top side of the semiconductor layer structure; and
a gate terminal, a drain terminal and a source terminal, at least two of which are on the bottom side of the semiconductor layer structure,
wherein the gate terminal is electrically connected to the plurality of gate fingers via one or more conductive gate vias, the drain terminal is electrically connected to the plurality of drain fingers via one or more conductive drain vias, and the source terminal is electrically connected to the plurality of source fingers via one or more conductive source vias, and
wherein at least one of the one or more conductive gate vias and the one or more conductive drain vias is offset from the one or more conductive source vias.

17. The Group III nitride-based RF amplifier die of claim 16, wherein the semiconductor layer structure comprises a growth substrate, a channel layer and a barrier layer, where the channel layer is between the growth substrate and the barrier layer, and
wherein the one or more conductive gate vias, the one or more conductive drain vias and the one or more conductive source vias extend completely through the growth substrate.

18. The RF amplifier of claim 1, wherein the matching circuit comprises at least one of an impedance matching circuit and a harmonic termination circuit.

19. The RF amplifier of claim 1, wherein the gate terminal is electrically connected to the unit cell transistors through one or more conductive gate vias, the drain terminal is electrically connected to the unit cell transistors through one or more conductive drain vias, and the source terminal is electrically connected to the unit cell transistors through one or more conductive source vias, and wherein at least one of the conductive gate vias and the conductive drain vias are offset from the conductive source vias.

20. The Group III nitride-based RF amplifier die of claim 16, wherein an inductance of at least one of the one or more conductive gate vias and the one or more conductive drain vias comprises at least a portion of a matching circuit.

* * * * *

UNITED STATES PATENT AND TRADEMARK OFFICE
CERTIFICATE OF CORRECTION

Page 1 of 1

PATENT NO. : 11,837,559 B2
APPLICATION NO. : 17/211281
DATED : December 5, 2023
INVENTOR(S) : Watts et al.

It is certified that error appears in the above-identified patent and that said Letters Patent is hereby corrected as shown below:

On the Title Page

(71) Applicant: Please correct "Cree, Inc." to read --Wolfspeed, Inc.--

(56) References Cited, OTHER PUBLICATIONS, Page 3, Column 1, Line 13: Please correct "Jun. 13, 2021" to read --Jun. 18, 2021--

Signed and Sealed this
Twenty-seventh Day of February, 2024

Katherine Kelly Vidal
*Director of the United States Patent and Trademark Office*